(12) United States Patent
Yokobayashi

(10) Patent No.: US 9,246,067 B2
(45) Date of Patent: Jan. 26, 2016

(54) SEMICONDUCTOR LIGHT EMITTING DEVICE AND VEHICLE LAMP

(71) Applicant: STANLEY ELECTRIC CO., LTD., Tokyo (JP)

(72) Inventor: Yusuke Yokobayashi, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 246 days.

(21) Appl. No.: 13/653,677

(22) Filed: Oct. 17, 2012

(65) Prior Publication Data

US 2013/0100692 A1   Apr. 25, 2013

(30) Foreign Application Priority Data

Oct. 19, 2011   (JP) ................................. 2011-229975

(51) Int. Cl.
H01L 33/00 (2010.01)
H01L 33/50 (2010.01)
F21S 8/10 (2006.01)

(52) U.S. Cl.
CPC ........... *H01L 33/504* (2013.01); *F21S 48/1154* (2013.01); *F21S 48/1159* (2013.01); *H01L 33/505* (2013.01); *H01L 33/508* (2013.01)

(58) Field of Classification Search
CPC .... H01L 33/504; H01L 33/508; H01L 33/502
USPC .......................................... 257/98, E33.061
See application file for complete search history.

(56) References Cited

U.S. PATENT DOCUMENTS

| | | | |
|---|---|---|---|
| 7,301,175 B2 | 11/2007 | Izuno et al. | |
| 7,390,684 B2 | 6/2008 | Izuno et al. | |
| 7,709,849 B1 | 5/2010 | Kal et al. | |
| 7,812,516 B2 | 10/2010 | Maruyama et al. | |
| 7,846,755 B2 | 12/2010 | Kal et al. | |

(Continued)

FOREIGN PATENT DOCUMENTS

| | | |
|---|---|---|
| EP | 1020935 A2 | 7/2000 |
| JP | 2005-123560 A | 5/2005 |

(Continued)

OTHER PUBLICATIONS

Japanese Office Action (and English translation thereof) dated Aug. 5, 2015, issued in counterpart Japanese Application No. 2011-229975.

(Continued)

*Primary Examiner* — Jesse Y Miyoshi
(74) *Attorney, Agent, or Firm* — Holtz, Holtz & Volek PC

(57) ABSTRACT

A semiconductor light emitting device which produces mixed light of a desired emission color by a combination of a semiconductor light emitting element and a wavelength converting layer containing a fluorescent substance, and a vehicle lamp including the semiconductor light emitting device. The wavelength converting layer has different wavelength conversion characteristics respectively at its portion covering an area of relatively high current density at light emission operation of the semiconductor light emitting element and at its portion covering an area of relatively low current density so as to reduce chromaticity difference over the light extraction surface of the mixed light due to non-uniformity of current density in the light emitting layer at light emission operation.

8 Claims, 17 Drawing Sheets

(56) References Cited

U.S. PATENT DOCUMENTS

| | | | |
|---|---|---|---|
| 7,955,875 B2* | 6/2011 | Hardin | 438/7 |
| 2004/0041220 A1* | 3/2004 | Kwak et al. | 257/432 |
| 2005/0068787 A1* | 3/2005 | Ishida | 362/538 |
| 2008/0303410 A1* | 12/2008 | Kaneda et al. | 313/503 |
| 2009/0001869 A1* | 1/2009 | Tanimoto et al. | 313/502 |
| 2009/0140633 A1* | 6/2009 | Tanimoto et al. | 313/503 |
| 2009/0261358 A1* | 10/2009 | Chitnis et al. | 257/88 |
| 2010/0081218 A1 | 4/2010 | Hardin | |

FOREIGN PATENT DOCUMENTS

| | | |
|---|---|---|
| JP | 2006-210491 A | 8/2006 |
| JP | 2006-310893 A | 11/2006 |
| JP | 2006-351708 A | 12/2006 |
| JP | 2007180111 A | 7/2007 |
| JP | 2008-060286 A | 3/2008 |
| JP | 2008135537 A | 6/2008 |
| JP | 2008205511 A | 9/2008 |
| JP | 2008541411 A | 11/2008 |
| JP | 2010013608 A | 1/2010 |
| JP | 2010147462 A | 7/2010 |
| JP | 2010-171376 A | 8/2010 |
| JP | 2010225437 A | 10/2010 |
| JP | 2013012516 A | 1/2013 |
| WO | 2006121196 A1 | 11/2006 |
| WO | 2007052777 A1 | 5/2007 |
| WO | 2009020547 A2 | 2/2009 |
| WO | 2009123726 A2 | 10/2009 |

OTHER PUBLICATIONS

Extended European Search Report dated Nov. 3, 2015, issued in counterpart European Application No. 12007081.8.

* cited by examiner

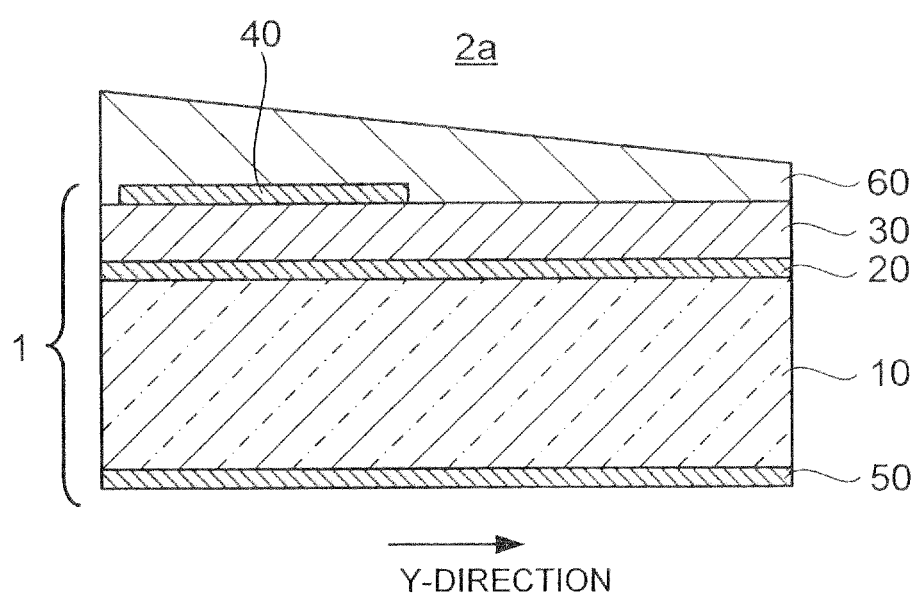

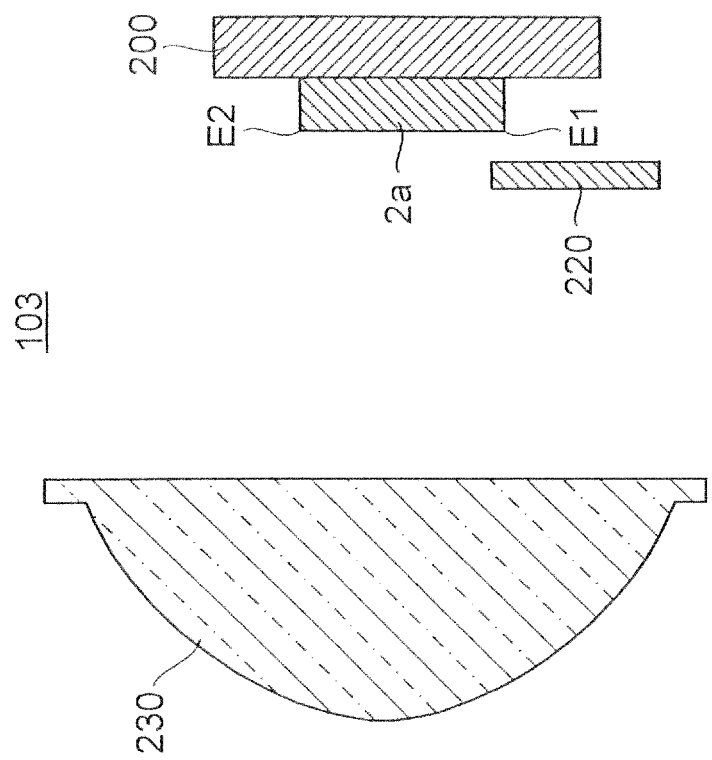

SEMICONDUCTOR LIGHT EMITTING DEVICE AND VEHICLE LAMP

BACKGROUND OF THE INVENTION

1. Field of the Invention

The present invention relates to a semiconductor light emitting device including a semiconductor light emitting element such as an LED (light emitting diode), and a vehicle lamp comprising the semiconductor light emitting device.

2. Description of the Related Art

There have been known semiconductor light emitting devices which have a semiconductor light emitting element (hereinafter also called simply a light emitting element) that emits light having a specific wavelength when a current is injected and a fluorescent substance that absorbs part of light from the light emitting element to emit light having a wavelength longer than that of the light from the light emitting element in combination. With these semiconductor light emitting devices, light from the light emitting element and light from the fluorescent substance are mixed, so that mixed light of a desired emission color can be obtained.

For example, Patent Literature 1 describes a semiconductor light emitting device which comprises a case having a cavity formed therein, an LED element provided at the bottom of the case, and resin containing a fluorescent substance and filled in the cavity to bury the LED element. Patent Literature 2 and Patent Literature 3 describe a semiconductor light emitting device wherein the top and side surfaces of a semiconductor light emitting element are covered with a wavelength converting layer having a fluorescent substance dispersed therein. In this configuration, by making the coating thickness of the wavelength converting layer uniform which covers the semiconductor light emitting element, the proportion of light wavelength-converted by the wavelength converting layer becomes uniform across the entire area, so that the mixing ratio of blue light emitted from the semiconductor light emitting element to yellow light emitted from the fluorescent substance becomes uniform, and thus mixed light with less color unevenness can be obtained. For example, in the case where a semiconductor light emitting device is configured with a blue light emitting element having an emission wavelength of about 450 nm and a YAG-based yellow fluorescent substance having an emission wavelength of about 570 nm in combination, mixed light with a degree of chromaticity on the line segment joining point B and point Y on a chromaticity coordinate system shown in FIG. 1 can be obtained. For example, when trying to obtain mixed light with a degree of chromaticity corresponding to point W on line segment B-Y, the coating amount (thickness) of the wavelength converting layer should be adjusted as needed according to the brightness of the light emitting element.

For example, a light emitting element made of group III nitride-based semiconductors is produced by crystal growing sequentially an n-type semiconductor layer, a light emitting layer, and a p-type semiconductor layer, which are made mainly of a group III nitride-based semiconductor, over a sapphire substrate. An n-electrode is formed on the surface of the n-type semiconductor layer exposed by partially removing the p-type semiconductor layer and the light emitting layer from the p-type semiconductor layer side as described in, e.g., Patent Literature 4 and Patent Literature 5. Or, as described in Patent Literature 6, the n-electrode may be formed on the surface of the n-type semiconductor layer exposed by removing the sapphire substrate after a support substrate is bonded to the surface of the p-type semiconductor layer. Sometimes the former is called a lateral element and the latter is called a vertical element because of the placement relationship between the n-electrode and the p-electrode. For each electrode of the light emitting element, in addition to a bonding pad, line portions extending over the surface of the semiconductor film may be provided in order to promote current diffusion in the semiconductor film. By providing the line portions, the entire light emitting layer can be made to function effectively, thus improving light output and luminous efficiency.

CITATION LIST

Patent Literature

PTL1: Japanese Patent Kokai No. 2006-351708
PTL2: Japanese Patent Kokai No. 2005-123560
PTL3: Japanese Patent Kokai No. 2006-210491
PTL4: Japanese Patent Kokai No. 2006-310893
PTL5: Japanese Patent Kokai No. 2008-060286
PTL6: Japanese Patent Kokai No. 2010-171376

SUMMARY OF THE INVENTION

Color Unevenness Due to Non-Uniformity in the Brightness Distribution Over the Light Emitting Surface of the Light Emitting Element In connection with units such as general lighting units and backlights for liquid crystal displays, there are many cases where brightness and color in their illumination range or display range are desired to be uniform. Hence, the brightness distribution and emission color in the light emitting surface of the semiconductor light emitting device used in these units are required to be uniform. Meanwhile, in semiconductor light emitting devices used in vehicle lamps such as car headlights, the brightness distribution over the light emitting surface may be intentionally made to be non-uniform in order to efficiently obtain a desired light distribution pattern. The configurations of such semiconductor light emitting devices and vehicle lamps using them as light sources are described in detail in, e.g., Japanese Patent Application Nos. 2010-187585, 2010-187586, 2010-201296, and 2010-201297, which were filed by the present inventors. If a wavelength converting layer of a uniform thickness and concentration is formed on the light emitting surface of a light emitting element having such a non-uniform brightness distribution, the mixing ratio of light wavelength-converted by the wavelength converting layer to light passing through the wavelength converting layer without being wavelength-converted is different between low brightness areas and high brightness areas, resulting in color unevenness occurring in the mixed light.

Meanwhile, even in a light emitting element wherein electrodes and the like are placed so as to make the brightness distribution over the light emitting surface uniform, it is difficult to make the brightness distribution completely uniform, and thus the above problem of color unevenness may occur. That is, in these years as light emitting elements are improving in quality and their application is widening, their brightness is becoming higher with the amount of current injected into the light emitting elements increasing, and accordingly the current density distribution inside the light emitting element and the brightness distribution over the light emitting surface are becoming likely to be non-uniform. Further, in these years the sizes of light emitting elements are increasing, and correspondingly the distances between n-electrodes and p-electrodes are increasing. Hence, the high-low difference in the current density inside the light emitting element is increasing, and thus it is becoming more and more difficult to make the brightness distribution over the light emitting surface uniform, so that the way to deal with the above problem of color unevenness is becoming important.

Color Unevenness Due to Non-Uniformity in the Emission Wavelength Distribution Over the Light Emitting Surface of the Light Emitting Element With light emitting elements made of group III nitride-based semiconductors, there is a known phenomenon referred to as so-called blue shift, where the wavelength of light emitted from areas of high current density at light emission operation becomes shorter. For example, if the current density changes from 10 A/cm$^2$ to 100 A/cm$^2$, then the emission wavelength may become about 20 nm shorter. That is, when the current density distribution inside the light emitting element is non-uniform at light emission operation, the emission wavelength distribution over the light emitting surface is also non-uniform.

Where the wavelength of light emitted from the light emitting element has deviated from a standard wavelength (point B in FIG. 1) to the shorter wavelength side (point $B_S$ in FIG. 1), the chromaticity of mixed light obtained through combination with a fluorescent substance exists on the line segment joining point $B_S$ and point Y on the chromaticity coordinate system shown in FIG. 1. In contrast, where the wavelength of light emitted from the light emitting element has deviated from the standard wavelength (point B in FIG. 1) to the longer wavelength side (point $B_L$ in FIG. 1), the chromaticity of mixed light obtained through combination with the fluorescent substance exists on the line segment joining point $B_L$ and point Y. Note that the wavelength (chromaticity) of light emitted from the fluorescent substance is hardly affected by the excitation wavelength (that is, the emission wavelength of the light emitting element), so that it is maintained at the point Y in either case. Because neither of the line segments $B_S$-Y and $B_L$-Y passes through point W corresponding to the target chromaticity of mixed light, when the emission wavelength of the light emitting element has shifted, mixed light having the target chromaticity cannot be obtained even if the thickness of the wavelength converting layer is adjusted or so on. As such, if the current density distribution inside the light emitting element is non-uniform at light emission operation, the emission wavelength distribution over the light emitting surface is also non-uniform, resulting in color unevenness occurring in mixed light obtained through combination with the fluorescent substance.

Conventionally, the amount of current injected into the light emitting element has not been large, and hence the difference in the current density inside the light emitting element has not been conspicuous. Further, the full width at half maximum of the emission spectrum of the light emitting element is about 30 nm, whereas the full width at half maximum of, e.g., a YAG-based fluorescent substance that is a typical yellow fluorescent substance is as wide as 130 nm. Hence, if the wavelength of light emitted from the light emitting element deviated by about 1 to 2 nm, the chromaticity of mixed light would not greatly change. Further, conventionally, by means of the patterning of the n-electrode or p-electrode, the insertion of a transparent electrode for promoting current diffusion, or the like, the current density distribution in the light emitting element could be kept uniform. But in these years the application of light emitting elements is widening to general lighting and vehicle lamps with the demand for higher output increasing, and accordingly the amount of current fed into the light emitting elements is increasing, and the element sizes are also increasing. Further, the standard for the uniformity of the emission color over the light emitting surface of light emitting devices is becoming increasingly strict, and thus even if the electrode structure is devised or so on, it is becoming difficult to satisfy the required standard concerning the uniformity of the emission color.

The present invention has been made in view of the above facts, and an object thereof is to provide a semiconductor light emitting device which comprises a light emitting element and a wavelength converting layer including a fluorescent substance in combination to obtain mixed light of a desired emission color, wherein color unevenness in the mixed light due to a non-uniform brightness distribution or emission wavelength distribution over the light emitting surface of the light emitting element can be suppressed, and a vehicle lamp comprising this semiconductor light emitting device.

Solution to Problem

According to one aspect of the present invention, there is provided a semiconductor light emitting device which includes a semiconductor light emitting element, having a light emitting layer that emits light due to current injection, and a wavelength converting layer containing a fluorescent substance and provided on a light emitting surface of the semiconductor light emitting element and which emits, through a light extraction surface thereof, mixed light of light emitted from the semiconductor light emitting element and wavelength-converted by the wavelength converting layer and light having passed through the wavelength converting layer. The semiconductor light emitting element has non-uniformity of current density in the light emitting layer at light emission operation, and the wavelength converting layer has different wavelength conversion characteristics respectively at its portion covering an area of relatively high current density at light emission operation of the semiconductor light emitting element and at its portion covering an area of relatively low current density so as to reduce chromaticity difference over the light extraction surface of the mixed light due to non-uniformity of current density in the light emitting layer at the light emission operation.

According to another aspect of the present invention, there is provided a vehicle lamp which includes the above semiconductor light emitting device as a light source, comprising an optical system that projects light from the semiconductor light emitting device in an irradiation direction to form a projection image on an irradiation plane. The semiconductor light emitting device has a brightness distribution corresponding to the current density distribution at the light emission operation of the semiconductor light emitting element, and the optical system forms the projection image such that image parts corresponding to a part having a peak of brightness of the semiconductor light emitting device form a line along a cutoff line.

In the semiconductor light emitting device according to the one aspect of the present invention, the wavelength converting layer covering the light emitting surface of the semiconductor light emitting element has different wavelength conversion characteristics respectively at its portion covering the area of relatively high current density of the semiconductor light emitting element and at its portion covering the area of relatively low current density so as to reduce chromaticity difference occurring in the mixed light due to the non-uniform current density distribution at light emission operation in the semiconductor light emitting element, and hence even though the brightness distribution or emission wavelength distribution over the light emitting surface of the semiconductor light emitting element is non-uniform, the occurrence of color unevenness in mixed light can be suppressed. Thus, with the semiconductor light emitting device according to the present invention, a uniform emission color can be obtained with a desired brightness distribution being formed, and therefore the semiconductor light emitting device can be a light source suitable for use in, e.g., vehicle lamps.

In the vehicle lamp according to the other aspect of the present invention, the projection image is formed such that image parts corresponding to a part having a peak of brightness of the semiconductor light emitting device form a line along a cutoff line, and hence a light distribution pattern suitable for a passing-each-other beam can be formed with suppressing the amount of light cut off by a light-shielding member such as a shade to a minimum. Thus the use efficiency of light from the semiconductor light emitting device as a light source can be improved. Because the semiconductor light emitting device according to the present invention emits mixed light without color unevenness as described above, also with the vehicle lamp comprising this semiconductor light emitting device as a light source, a projection image without color unevenness can be generated.

BRIEF DESCRIPTION OF THE DRAWINGS

FIG. 3 is a cross-sectional view showing the configuration of a semiconductor light emitting device according to Embodiment 1 of the present invention;

FIG. 11 is a diagram showing the configuration of a vehicle lamp comprising, as a light source, the semiconductor light emitting device according to an embodiment of the present invention;

DETAILED DESCRIPTION OF THE INVENTION

Figure 1:
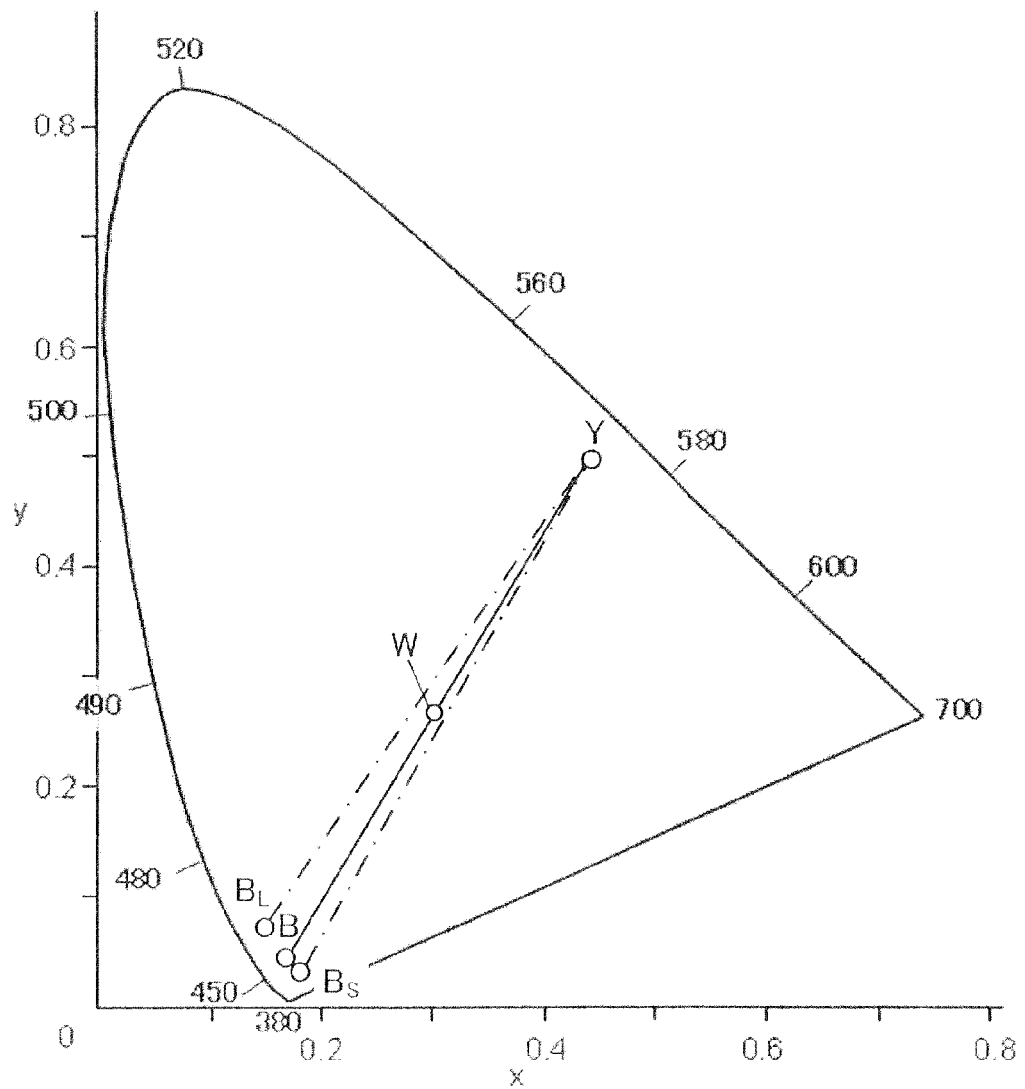
FIG. 1 is a chromaticity graph showing the chromaticity of mixed light obtained through a combination of a semiconductor light emitting element and a wavelength converting layer.

Embodiments of the present invention will be described below with reference to the drawings. The same reference numerals are used to denote substantially the same or equivalent constituents and parts throughout the drawings.

Embodiment 1

Figure 2A:
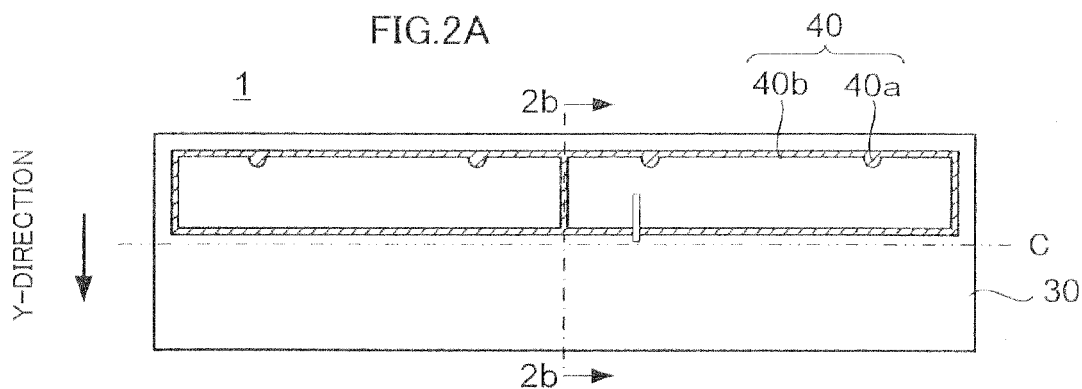
FIG. 2A is a plan view showing the configuration of a semiconductor light emitting element according to an embodiment of the present invention.
Figure 2B:
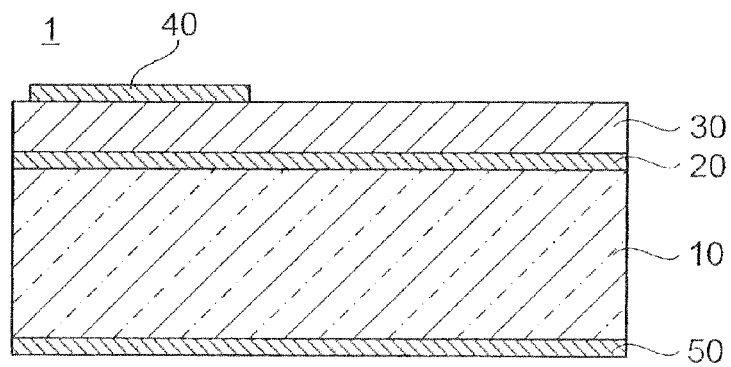
FIG. 2B is a cross-sectional view taken along line 2b-2b in FIG. 2A.
Figure 2C:
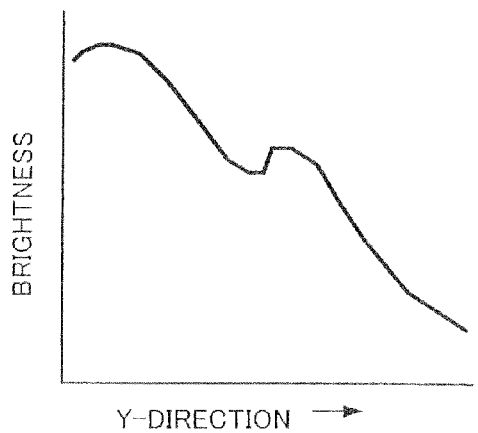
FIG. 2C is a graph showing the brightness distribution of the semiconductor light emitting element according to the embodiment of the present invention.

FIG. 2A is a plan view showing the configuration of a semiconductor light emitting element 1 according to an embodiment of the present invention, and FIG. 2B is a cross-sectional view taken along line 2b-2b in FIG. 2A. FIG. 2C is a graph showing the brightness distribution along the Y-direction in FIG. 2A of the semiconductor light emitting element 1. The semiconductor light emitting element 1 is a so-called thin-film structured light emitting element comprising a semiconductor film 30 and a support substrate 10 bonded together. Also, the semiconductor light emitting element 1 is a so-called vertically-structured light emitting element wherein a p-electrode 20 and an n-electrode 40 are placed opposite each other on opposite sides of the semiconductor film 30.

The support substrate 10 is made of, e.g., material of higher thermal conductivity (such as silicon or metal) than a growth substrate (not shown) used in the crystal growth of the semiconductor film 30. The p-electrode 20 forming a light-reflecting surface is provided between the support substrate 10 and the semiconductor film 30. The semiconductor film 30 is configured with a p-type semiconductor layer, a light emitting layer, and an n-type semiconductor layer laid one over another in that order from the p-electrode 20 side. The semiconductor film 30 is formed by, for example, crystal-growing group III nitride-based semiconductor crystals on a growth substrate such as a sapphire substrate. The n-electrode 40 is provided on the surface of the semiconductor film 30 (the n-type semiconductor layer). The n-electrode 40 comprises pad portions 40*a* to which a feed wire (bonding wire) is to be connected and line portions 40*b* connected to the pad portions 40*a* and extending over the surface of the semiconductor film 30. The n-electrode 40 exists exclusively on the area above the center line C of the surface of the semiconductor film 30 having a substantially rectangular outline in plan view. As such, by making the n-electrode 40 be of a non-symmetric pattern, which exists exclusively on a particular area of the surface of the semiconductor film 30, a non-uniform brightness distribution as shown in FIG. 2C is formed on the light emitting surface at the time of light emission operation. That is, the semiconductor light emitting element 1 has current density and brightness distributions where current density and brightness have a peak near the edge on the side where the n-electrode 40 extends and gradually decrease when going in the Y-direction. A solder layer 50 for mounting the semiconductor light emitting element 1 on a board is provided on the back surface of the support substrate 10.

FIG. 3 is a cross-sectional view showing the configuration of a semiconductor light emitting device 2*a* according to Embodiment 1 of the present invention, which is configured with a wavelength converting layer including a fluorescent substance laid over the surface (principal light emitting surface) of the semiconductor light emitting element 1 described above. The wavelength converting layer 60 is made by, e.g., making a YAG-based yellow fluorescent substance dispersed uniformly across a binder comprising silicone resin, epoxy resin, acrylic resin, or the like. Note that the wavelength converting layer 60 may be made of only a fluorescent substance. The fluorescent substance absorbs, e.g., blue light emitted from the semiconductor light emitting element 1 to emit yellow light. Yellow light wavelength-converted by the wavelength converting layer 60 and blue light passing through the wavelength converting layer 60 without being wavelength-converted are mixed and emitted from the surface of the wavelength converting layer 60 that is the light extraction surface of the semiconductor light emitting device 2*a*.

The wavelength converting layer 60 has a thickness distribution corresponding to the non-uniform brightness distribution (current density distribution) of the semiconductor light emitting element 1. That is, the semiconductor light emitting element 1 has a brightness distribution where brightness gradually decreases when going in the Y-direction as shown in FIG. 2C. The wavelength converting layer 60 is formed such that its thickness gradually decreases correspondingly to this brightness distribution when going in the Y-direction. Namely, the wavelength converting layer 60 has a thickness distribution where its portion covering an area of relatively high brightness (current density) at light emission operation of the semiconductor light emitting element 1 is large in thickness and where its portion covering an area of relatively low brightness (current density) is small in thickness. In this embodiment, the wavelength converting layer 60 has a surface at an angle to the surface (principal light emitting surface) of the semiconductor light emitting element 1 so that its thickness changes continuously. Note that the thickness of the wavelength converting layer 60 may change stepwise. In this case, the surface of the wavelength converting layer 60 has steps like a flight of stairs. As such, by making the thickness of the wavelength converting layer 60 correspond to the brightness distribution of the semiconductor light emitting element 1, the wavelength converting layer 60 converts more of blue light into yellow light for an area of high brightness (current density) of the semiconductor light emitting element 1 and less into yellow light for an area of low brightness (current density). That is, the wavelength converting layer 60 has different wavelength conversion characteristics respectively at its portion covering an area of high brightness (current density) of the semiconductor light emitting element 1 and at its portion covering an area of low brightness (current density). By this means, the proportion (mixing ratio) of blue light passing through the wavelength converting layer 60 without being wavelength-converted and extracted outside to yellow light wavelength-converted by the wavelength converting layer 60 and extracted outside becomes substantially the same over the light extraction surface of the semiconductor light emitting device 2*a*, and thus mixed light without color unevenness can be obtained. The wavelength converting layer 60 can be formed by coating the surface of the semiconductor light emitting element 1 with resin containing a fluorescent substance by a screen printing method, an ink-jet method, or the like and then shaping it so as to have a thickness distribution as described above. Or a wavelength converting layer shaped to have a desired shape by an insert molding method or the like may be stuck to the surface of the semiconductor light emitting element 1 with transparent resin adhesive.

Embodiment 2

Figure 4:
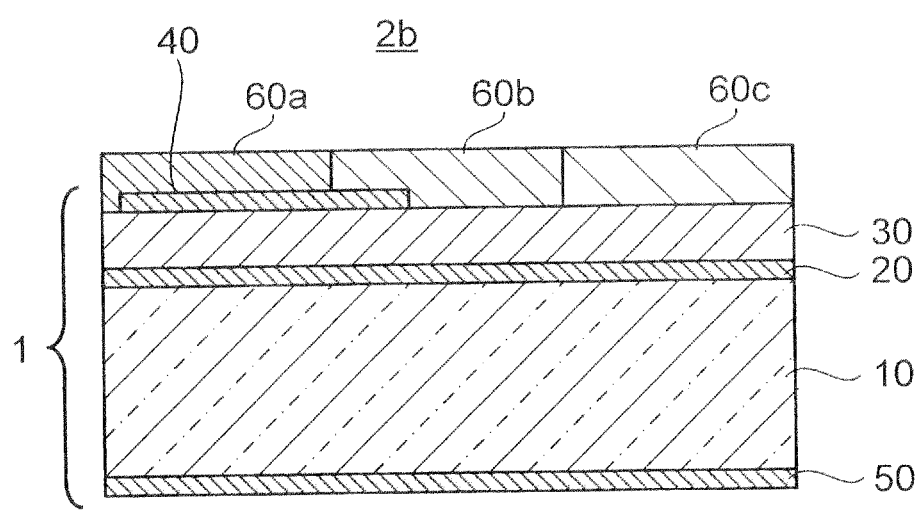
FIG. 4 is a cross-sectional view showing the configuration of a semiconductor light emitting device according to Embodiment 2 of the present invention.

FIG. 4 is a cross-sectional view showing the structure of a semiconductor light emitting device 2*b* according to Embodiment 2 of the present invention, which is configured with a wavelength converting layer containing a fluorescent substance and laid over the surface (principal light emitting surface) of the above semiconductor light emitting element 1. The semiconductor light emitting device 2*b* has three wavelength converting layers 60*a*, 60*b*, 60*c*, which are different in the concentration of a fluorescent substance contained therein, on the surface of the semiconductor light emitting element 1. The three wavelength converting layers 60*a*, 60*b*, 60*c* have the concentrations of the fluorescent substance adjusted correspondingly to the non-uniform brightness distribution at light emission operation of the semiconductor light emitting element 1. Namely, the concentration of the fluorescent substance contained in the wavelength converting layer 60*a*, which covers the area of the highest brightness (current density) of the semiconductor light emitting element 1, is adjusted to be the highest; the concentration of the fluorescent substance contained in the wavelength converting layer 60*c*, which covers the area of the lowest brightness (current density), is adjusted to be the lowest; and the concentration of the fluorescent substance contained in the wavelength converting layer 60*b*, which covers the area between the areas of the highest brightness and the lowest brightness, is adjusted to be between those of the other two. By this means, as in the above embodiment 1, more of blue light is converted into yellow light for an area of high brightness (current density) of the semiconductor light emitting element 1 and less is converted into yellow light for an area of low brightness (current density). That is, the wavelength converting layers have different wavelength conversion characteristics respectively at their portion covering an area of high brightness (current density) of the semiconductor light emitting element 1 and at their portion covering an area of low brightness (current density). Thus, the proportion (mixing ratio) of blue light passing through the wavelength converting layer 60a, 60b, 60c without being wavelength-converted and extracted outside to yellow light wavelength-converted by the wavelength converting layer 60a, 60b, 60c and extracted outside becomes substantially the same over the light extraction surface of the semiconductor light emitting device 2b, and thus mixed light without color unevenness can be obtained. Although in this embodiment the case where the three wavelength converting layers 60a, 60b, 60c, which are different in the concentration of a fluorescent substance contained therein, are provided is illustrated, two or no less than four wavelength converting layers which are different in the concentration of a fluorescent substance contained therein may be provided.

Embodiment 3

Figure 5:
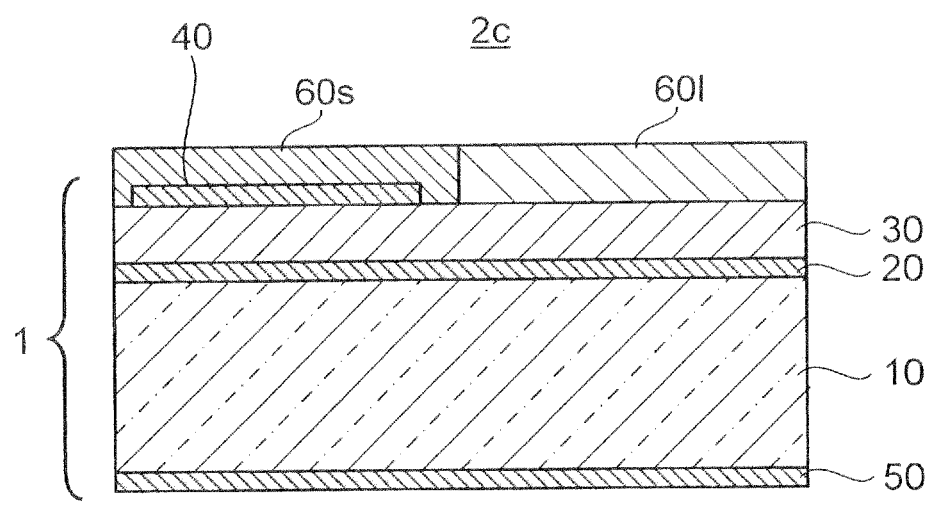
FIG. 5 is a cross-sectional view showing the configuration of a semiconductor light emitting device according to Embodiment 3 of the present invention.

FIG. 5 is a cross-sectional view showing the structure of a semiconductor light emitting device 2c according to Embodiment 3 of the present invention, which is configured with a wavelength converting layer containing a fluorescent substance and laid over the surface of the above semiconductor light emitting element 1. In the semiconductor light emitting device 2c, wavelength converting layers 60s, 601, which contain fluorescent substances having different dominant wavelengths, are provided on the surface of the semiconductor light emitting element 1.

In the semiconductor light emitting element 1, the current density is high at the area over which the n-electrode 40 extends and low at the area over which the n-electrode 40 does not extend. Hence, the emission wavelength at the area over which the n-electrode 40 extends is shorter than the emission wavelength at the area over which the n-electrode 40 does not extend (blue shift). That is, the semiconductor light emitting element 1 has a non-uniform emission wavelength distribution corresponding to the current density distribution over the light emitting surface.

The wavelength converting layer 60s containing a fluorescent substance which generates yellow light of a shorter wavelength covers the area of high current density over which the n-electrode 40 extends (i.e., an area where blue light of a shorter wavelength is generated). In contrast, the wavelength converting layer 601 containing a fluorescent substance which generates yellow light of a longer wavelength covers the area of low current density over which the n-electrode 40 does not extend (i.e., an area where blue light of a longer wavelength is generated).

Figure 6:
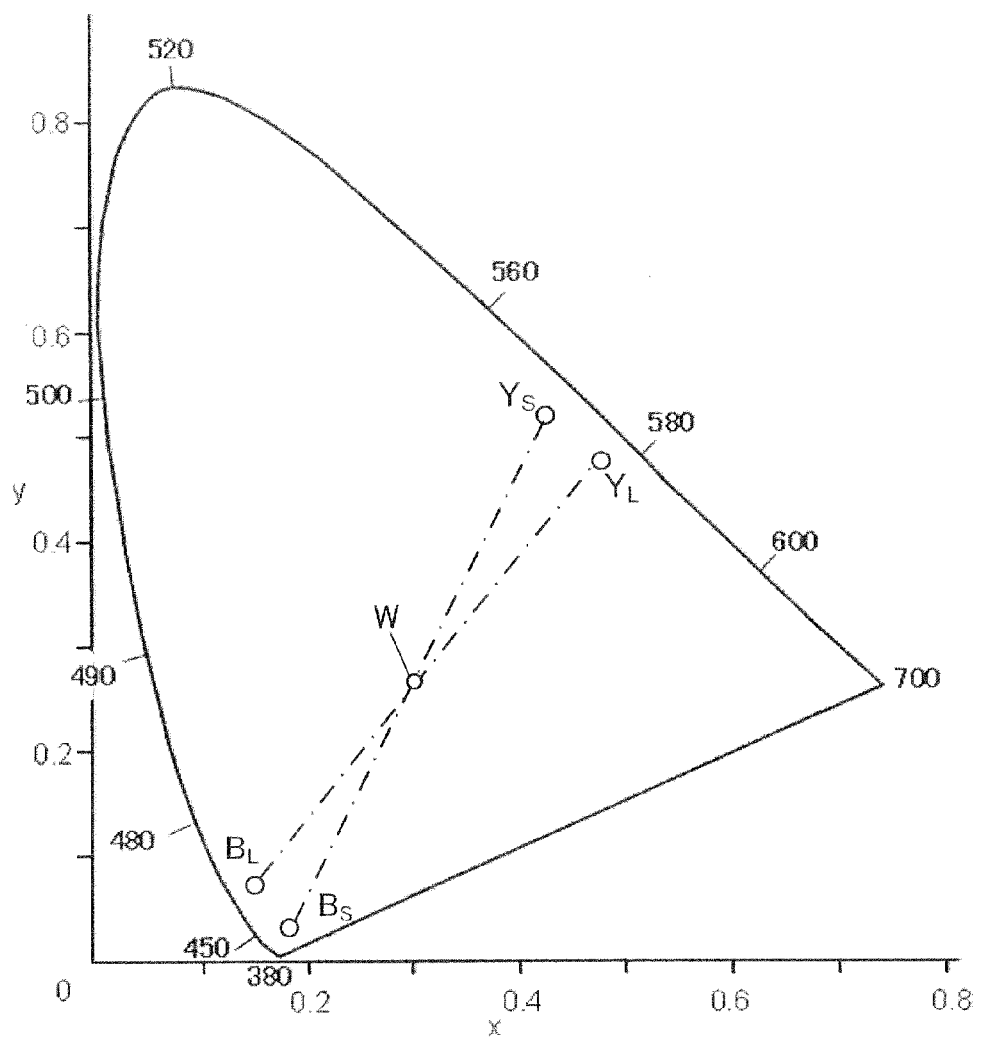
FIG. 6 is a chromaticity graph showing the chromaticity of mixed light obtained through a combination of a semiconductor light emitting element and a wavelength converting layer.

The chromaticity of blue light emitted from the area of high current density of the semiconductor light emitting element 1 corresponds to point $B_S$ on a chromaticity coordinate system shown in FIG. 6. The chromaticity of light emitted by the fluorescent substance contained in the wavelength converting layer 60s covering this area is set such that mixed light with the target chromaticity (point W) is obtained. In other words, the chromaticity (point $Y_S$) of light emitted by the fluorescent substance contained in the wavelength converting layer 60s is set such that the line segment joining point $Y_S$, corresponding to the chromaticity of light emitted by the fluorescent substance contained in the wavelength converting layer 60s, and point $B_S$ passes through point W.

Likewise, the chromaticity of blue light emitted from the area of low current density of the semiconductor light emitting element 1 corresponds to point $B_L$ on the chromaticity coordinate system shown in FIG. 6. The chromaticity of light emitted by the fluorescent substance contained in the wavelength converting layer 601 covering this area is set such that mixed light with the target chromaticity (point W) is obtained. In other words, the chromaticity of light emitted by the fluorescent substance contained in the wavelength converting layer 601 is set such that the line segment joining point $Y_L$, corresponding to the chromaticity of light emitted by the fluorescent substance contained in the wavelength converting layer 601, and point $B_L$ passes through point W. That is, the chromaticity of light emitted by the fluorescent substance contained in each of the wavelength converting layers 60s, 601 is set such that the line segment joining point $Y_S$ and point $B_S$ and the line segment joining point $Y_L$ and point $B_L$ intersect at point W. As such, the wavelength converting layer has different wavelength conversion characteristics respectively at its portion covering an area of relatively high current density at light emission operation of the semiconductor light emitting element 1 and at its portion covering an area of relatively low current density. In this embodiment, the concentration of the fluorescent substance in each of the wavelength converting layers 60s, 601 is adjusted so that mixed light with chromaticity corresponding to point W is obtained in each area.

As such, by setting the dominant wavelength at light emission of the fluorescent substance contained in the wavelength converting layer according to the current density distribution (emission wavelength distribution) of the semiconductor light emitting element 1, the influence of blue shift occurring in the semiconductor light emitting element 1 is compensated for, so that mixed light without color unevenness can be obtained. The adjustment of the dominant wavelength at light emission of the fluorescent substance can be achieved simply by the selection of a fluorescent substance. For example, for the YAG-based fluorescent substance, by increasing the amount of Ga and/or Lu doped in a host crystal structure, the dominant wavelength can be made shorter, and by increasing the amount of Gd, the dominant wavelength can be made longer. The fluorescent substances contained in the wavelength converting layers 60s, 601 are preferably the same in the host crystal structure. When selecting fluorescent substances of the same host crystal structure, the fluorescent substances are similar to each other in properties other than emission wavelength such as heat-resistance, lifetime, and optical responsivity, and thus chromaticity deviation over time can be suppressed.

Embodiment 4

Figure 7A:
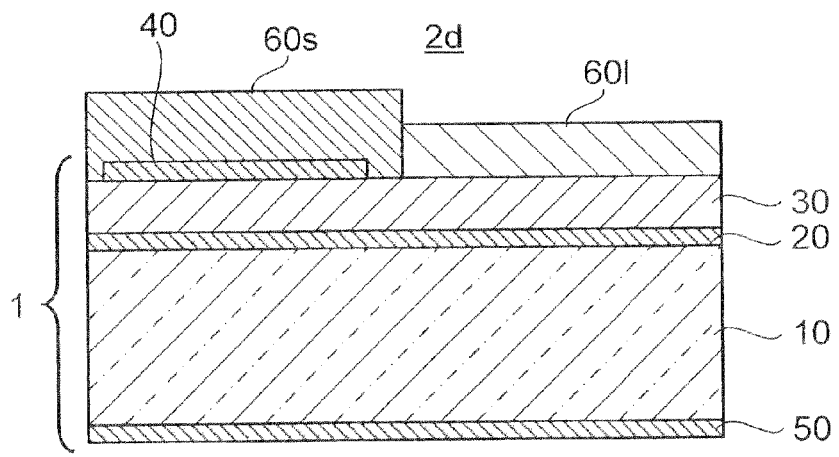
FIG. 7A is a cross-sectional view showing the configuration of a semiconductor light emitting device according to Embodiment 4 of the present invention.

FIG. 7A is a cross-sectional view showing the structure of a semiconductor light emitting device 2d according to Embodiment 4 of the present invention, which is configured with a wavelength converting layer containing a fluorescent substance and laid over the surface of the above semiconductor light emitting element 1. In the semiconductor light emitting device 2d, wavelength converting layers 60s, 601, which contain respectively fluorescent substances having different dominant wavelengths, are provided on the surface of the semiconductor light emitting element 1. In the semiconductor light emitting device 2c according to the above embodiment 3, by adjusting the concentration of the fluorescent substance contained in each of the wavelength converting layers 60s, 601, the mixing ratio of blue light to yellow light is adjusted to obtain mixed light with desired chromaticity. In contrast, in the semiconductor light emitting device 2d according to the present embodiment, by adjusting the thicknesses of the wavelength converting layers 60s, 601, the mixing ratio of blue light to yellow light is adjusted to obtain mixed light with desired chromaticity. That is, the thickness of the wavelength converting layer 60s covering the area of high current density (over which the n-electrode 40 extends) of the semiconductor light emitting element 1 is larger than the thickness of the wavelength converting layer 601 covering the area of low current density (over which the n-electrode 40 does not extend). With the semiconductor light emitting device 2d according to this embodiment, the same effect can be obtained as with the semiconductor light emitting device 2c according to the above embodiment 3. Note that the thicknesses of the wavelength converting layers 60s, 601 may be continuously changed according to the current density distribution of the semiconductor light emitting element 1.

Embodiment 5

Figure 7B:
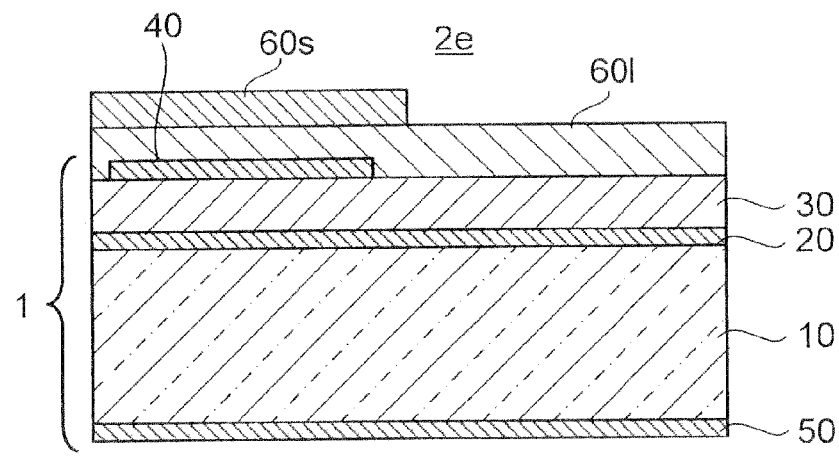
FIG. 7B is a cross-sectional view showing the configuration of a semiconductor light emitting device according to Embodiment 5 of the present invention.

FIG. 7B is a cross-sectional view showing the structure of a semiconductor light emitting device 2e according to Embodiment 5 of the present invention, which is configured with a wavelength converting layer containing a fluorescent substance and laid over the surface of the above semiconductor light emitting element 1. In the semiconductor light emitting device 2e, wavelength converting layers 60s, 601, which contain fluorescent substances having different dominant wavelengths, are provided on the surface of the semiconductor light emitting element 1. The wavelength converting layer 601, which contains a fluorescent substance having a longer dominant wavelength, covers the entire light emitting surface including areas of relatively high and low current densities at light emission operation of the above semiconductor light emitting element 1. In contrast, the wavelength converting layer 60s, which contains a fluorescent substance having a shorter dominant wavelength, covers only an area of relatively high current density (over which the n-electrode 40 extends) at light emission operation of the above semiconductor light emitting element 1. That is, the wavelength converting layers 60s and 601 are laid over the area of high current density at light emission operation of the semiconductor light emitting element 1. The dominant wavelength at the place where the wavelength converting layers 60s and 601 are laid one over the other is between the dominant wavelengths of the wavelength converting layers. With the semiconductor light emitting device 2e according to this embodiment, the same effect can be obtained as with the semiconductor light emitting device 2c according to the above embodiment 3. Further, the dominant wavelength of the portion covering the area of high current density at light emission operation of the semiconductor light emitting element 1 can be controlled through the ratio between the thicknesses of the wavelength converting layers 60s and 601, so that the chromaticity of mixed light can be adjusted with higher accuracy.

Embodiment 6

Figure 7C:
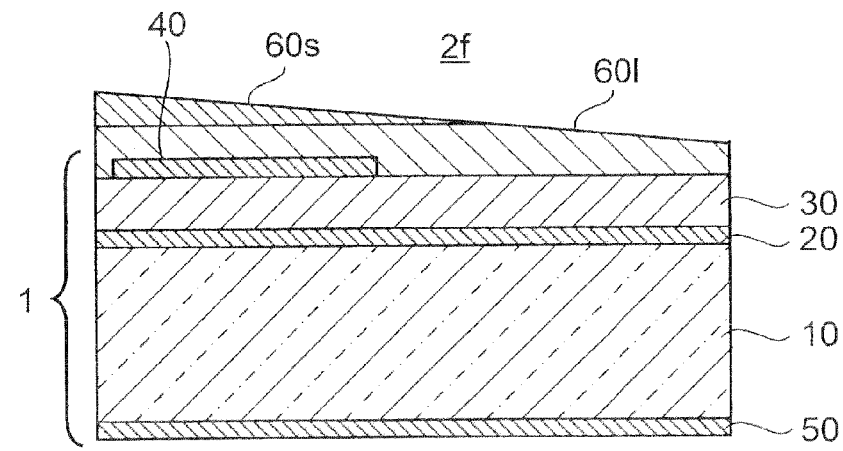
FIG. 7C is a cross-sectional view showing the configuration of a semiconductor light emitting device according to Embodiment 6 of the present invention.

FIG. 7C is a cross-sectional view showing the structure of a semiconductor light emitting device 2f according to Embodiment 6 of the present invention, which is configured with a wavelength converting layer containing a fluorescent substance and laid over the surface of the above semiconductor light emitting element 1. In the semiconductor light emitting device 2f, wavelength converting layers 60s, 601, which contain respectively fluorescent substances having different dominant wavelengths, are provided on the surface of the semiconductor light emitting element 1. The wavelength converting layer 601, which contains a fluorescent substance having a longer dominant wavelength, covers the entire light emitting surface including areas of relatively high and low current densities at light emission operation of the semiconductor light emitting element 1. In contrast, the wavelength converting layer 60s, which contains a fluorescent substance having a shorter dominant wavelength, covers only an area of relatively high current density (over which the n-electrode 40 extends) at light emission operation of the above semiconductor light emitting element 1. That is, the wavelength converting layers 60s and 601 are laid over the area of high current density at light emission operation of the semiconductor light emitting element 1. Further, the upper surfaces of the wavelength converting layers 60s and 601 slope to form a single plane, and the ratio between the thicknesses of these two wavelength converting layers continuously changes where the wavelength converting layers 60s and 601 are laid one over the other. With the semiconductor light emitting device 2f according to this embodiment, the same effect can be obtained as with the semiconductor light emitting device 2c according to the above embodiment 3. Further, because the dominant wavelength of the combined wavelength converting layer continuously changes from a shorter wavelength to a longer wavelength when going the area of high current density at light emission operation of the semiconductor light emitting element 1 to the area of low current density, the wavelength conversion characteristic of the combined wavelength converting layer can be made to correspond exactly to the current density distribution (emission wavelength distribution) of the semiconductor light emitting element 1, and thus the uniformity of the chromaticity of mixed light can be further improved.

Although in this specification a description has been made taking as an example the case of using a YAG-based yellow fluorescent substance as the fluorescent substance to be dispersed across the wavelength converting layer, another fluorescent substance may be used as long as it emits light of a desired color and dominant wavelength. For example, where blue light from a semiconductor light emitting element and yellow light from a wavelength converting layer are combined to form white light as in the embodiments, a silicate-based yellow fluorescent substance may be used instead of the YAG-based yellow fluorescent substance. Further, a wavelength converting layer having an emission color/dominant wavelength of yellow may be formed by using, e.g., a mixture of a red fluorescent substance and a green fluorescent substance as the fluorescent substance to be dispersed across the wavelength converting layer instead of a yellow fluorescent substance that is a single-color one (of one type). That is, by mixing a plurality of fluorescent substances, a wavelength converting layer of a desired emission color can be formed. Comparing the above case of using a mixture of green and red fluorescent substances and the case of using mainly a yellow fluorescent substance, in the former case, white including a wider range of emission colors is produced, even if it is of the same chromaticity, and hence the semiconductor light emitting device excellent in color reproducibility or color rendering can be formed. Meanwhile, in the former case a slight deviation of the fluorescent substance mixing ratio is likely to cause a large deviation of chromaticity. In order to manufacture a semiconductor light emitting device having a desired emission color stably and with good yield, a wavelength converting layer containing mainly a yellow fluorescent substance is preferably used as in the latter case.

Vehicle Lamp 1

Figure 8:
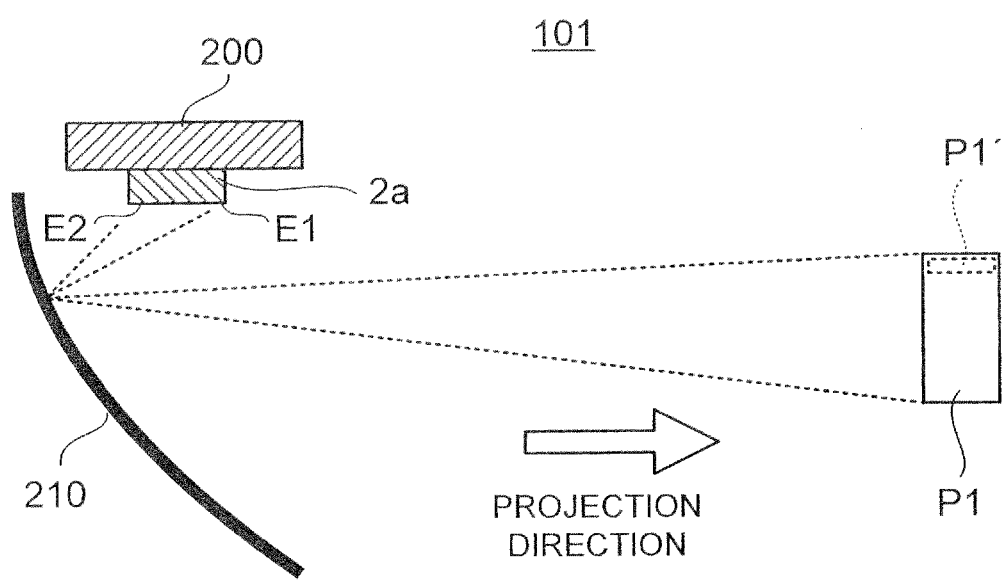
FIG. 8 is a diagram showing the configuration of a vehicle lamp comprising, as a light source, the semiconductor light emitting device according to an embodiment of the present invention.

FIG. 8 is a diagram showing the configuration of a vehicle lamp 101 (of a reflector type) comprising, as a light source, any of the semiconductor light emitting devices 2a to 2f according to Embodiments 1 to 6 of the present invention. In FIG. 8 and the description below, the semiconductor light emitting device 2a is cited as a representative but can be replaced with any of the semiconductor light emitting devices 2b to 2f.

The semiconductor light emitting device 2a (hereinafter also called simply a light emitting device 2a) is mounted on a mounting board 200 and then placed such that the light extraction surface faces downward in FIG. 8 and that the edge E1 on the high brightness side on which the n-electrode 40 extends faces in a forward projection direction with the edge E2 on the low brightness side on which the n-electrode 40 does not extend facing in a backward projection direction.

A reflector 210 forming an optical system has a light-reflecting surface forming a paraboloid of revolution, and its focal position is set to be near the light emitting device 2a. The reflecting surface of the reflector 210 forms a so-called multi-reflector composed of multiple unit reflecting surfaces. The reflector 210 is placed below the light emitting device 2a such that the light-reflecting surface surrounds the light emitting device 2a over a range from the back side of the projection direction to the front side thereof and reflects light from the light emitting device 2a to travel in the projection direction.

Figure 9:
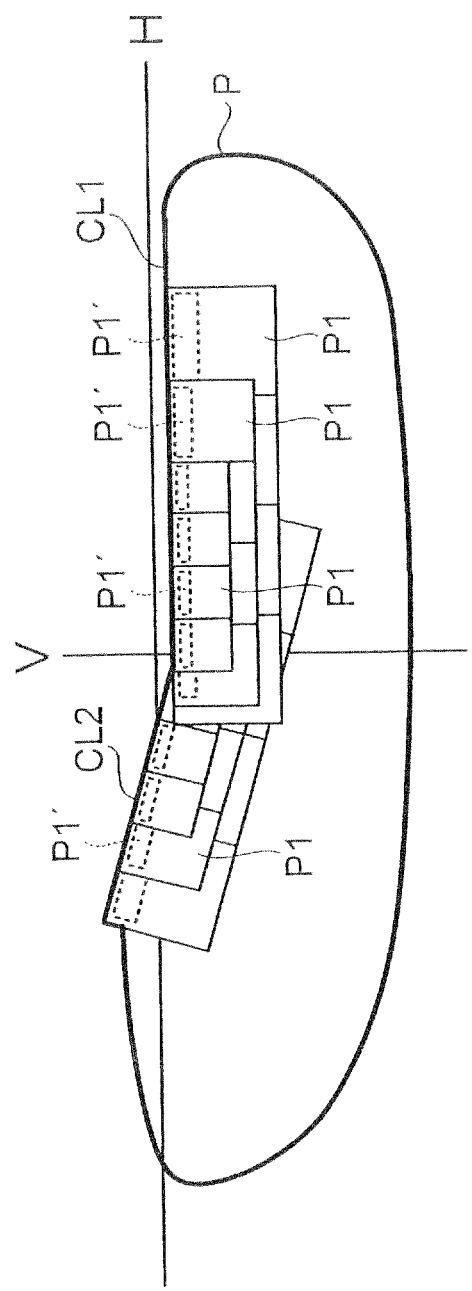
FIG. 9 is a diagram showing a light distribution pattern formed on a virtual vertical screen by the vehicle lamp according to an embodiment of the present invention.

As shown in FIG. 8, each of the unit reflecting surfaces forming the reflector 210 forms a unit projection image P1, oriented to have an image part P1' corresponding to the edge E1 on the high brightness side of the light emitting device 2a as its top or oblique top, on a virtual vertical screen located at the front in the projection direction of the vehicle lamp 101. That is, the brightness distribution of the semiconductor light emitting element 1 shown in FIG. 2C is reflected in the unit projection image P1, and an illuminance peak is formed at image part P1'. FIG. 9 is a diagram showing a light distribution pattern P formed on the virtual vertical screen by the vehicle lamp 101. As shown in FIG. 9, the reflector 210 having the light-reflecting surface of a multi-reflector structure generates multiple unit projection images P1, which are arranged densely along the horizontal direction and an oblique direction (e.g., at an angle of 15° to the horizontal line) on the virtual vertical screen to form the light distribution pattern P. The reflector 210 forms a projection image such that image parts P1' (i.e., illuminance peak parts) corresponding to the edge E1 on the high brightness side of the light emitting device 2a are arranged (forming a line) along a horizontal cutoff line CL1 and an oblique cutoff line CL2. By this means, a light distribution pattern can be formed which is brightest near the horizontal cutoff line CL1 and the oblique cutoff line CL2 and which gradually decreases in illuminance when going downward from these cutoff lines so as to be excellent in far-distance visibility and suitable for a passing-each-other beam.

Note that the cutoff line refers to a light-dark boundary line of light projected onto a light-irradiation surface. The light-dark difference between both sides of the cutoff line being clear is required of vehicle headlights. Accordingly, conventionally the light-dark difference has been created by cutting off a large part of light from the light source with a light-shielding member such as a shade, thus reducing light use efficiency. In contrast, in the vehicle lamp 101 according to an embodiment of the present invention, the semiconductor light emitting device 2a that is a light source has a peak of brightness at an edge of the light extraction surface (see FIG. 2C), and the reflector 210 forming an optical system arranges multiple unit projection images P1, reflecting this brightness distribution of the light source, along the cutoff lines to form a light distribution pattern. Hence, the vehicle lamp 101 can form the light distribution pattern suitable for a passing-each-other beam without using a light-shielding member such as a shade. That is, the use efficiency of light from the semiconductor light emitting device 2a as a light source can be improved. Further, although the semiconductor light emitting device 2a as a light source has a non-uniform brightness distribution with a peak of brightness at an edge thereof, the wavelength converting layer has different wavelength conversion characteristics respectively at its portion covering an area of high brightness of the light emitting element of the semiconductor light emitting device and at its portion covering an area of low brightness, thus suppressing the occurrence of color unevenness in mixed light, as described previously, and hence also with the vehicle lamp 101 comprising this semiconductor light emitting device as a light source, light without color unevenness can be obtained.

Vehicle Lamp 2

Figure 10:
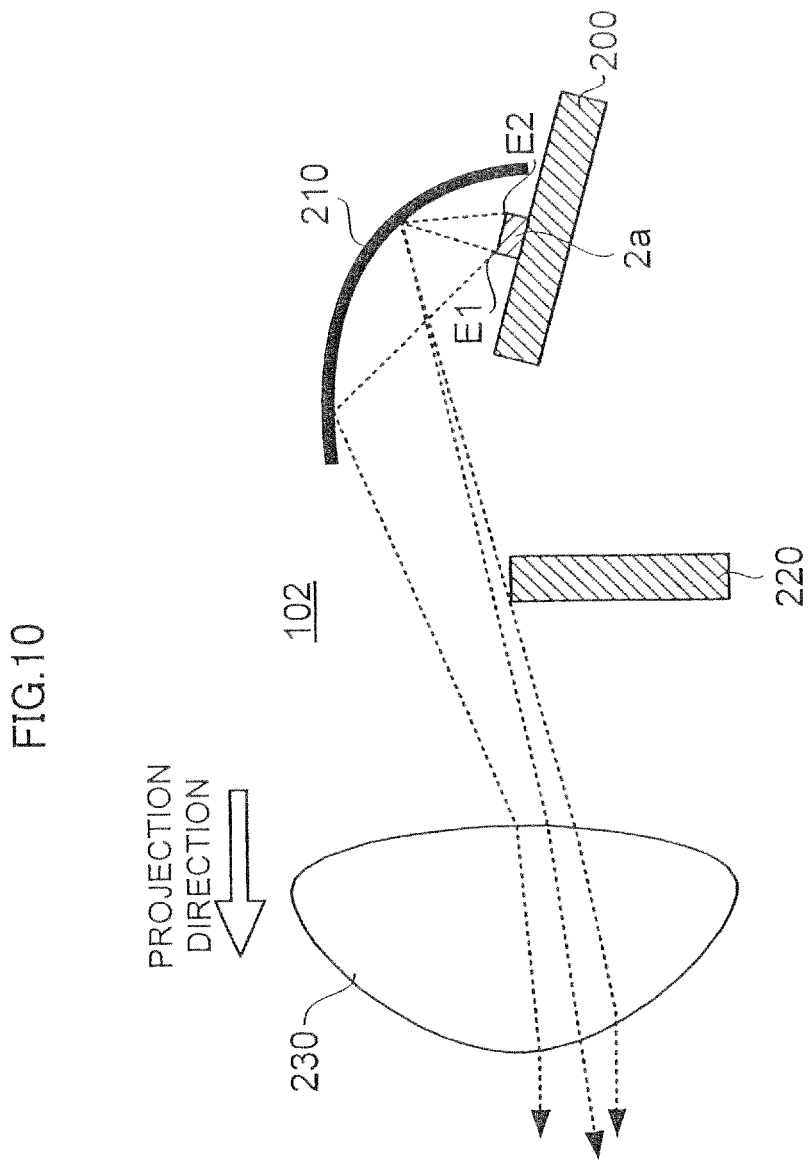
FIG. 10 is a diagram showing the configuration of a vehicle lamp comprising, as a light source, the semiconductor light emitting device according to an embodiment of the present invention.

FIG. 10 is a diagram showing the configuration of a vehicle lamp 102 (of a projector type) comprising, as a light source, any of the semiconductor light emitting devices 2a to 2f according to Embodiments 1 to 6 of the present invention. In FIG. 10 and the description below, the semiconductor light emitting device 2a is cited as a representative but can be replaced with any of the semiconductor light emitting devices 2b to 2f.

The semiconductor light emitting device 2a (hereinafter also called simply a light emitting device 2a) is mounted on a mounting board 200 and then placed such that the light extraction surface faces upward in FIG. 10 and that the edge E1 on the high brightness side on which the n-electrode 40 extends faces in a forward projection direction with the edge E2 on the low brightness side on which the n-electrode 40 does not extend facing in a backward projection direction.

A reflector 210 forming an optical system has a light-reflecting surface forming a paraboloid of revolution; its first focal position is set to be near the light emitting device 2a; and its second focal position is set to be near the upper edge of a shade 220. The light-reflecting surface of the reflector 210 forms a so-called multi-reflector composed of multiple unit reflecting surfaces. The reflector 210 is placed above the light emitting device 2a such that the light-reflecting surface surrounds the light emitting device 2a over a range from the back side of the projection direction to the front side thereof and reflects light from the light emitting device 2a to travel in the projection direction.

The shade 220 is a light-shielding member which cuts off part of light reflected from the reflector 210 to form cutoff lines. The shade 220 is placed between a projection lens 230, and the light emitting device 2a and the reflector 210 such that its upper edge is located at the focal point of the projection lens 230. The projection lens 230 expands and projects reflected light from the reflector 210.

Each of the unit reflecting surfaces forming the reflector 210 forms a unit projection image, oriented to have an image part corresponding to the edge E1 on the high brightness side of the light emitting device 2a as its top or oblique top, on a virtual vertical screen located at the front in the projection direction of the vehicle lamp 102. That is, the brightness distribution of the semiconductor light emitting element 1 shown in FIG. 2C is reflected in the unit projection image, and an illuminance peak is formed at the image part corresponding to the edge E1 on the high brightness side of the light emitting device 2a.

As shown in FIG. 9, the reflector 210 having the light-reflecting surface of a multi-reflector structure generates multiple unit projection images P1, which are arranged densely along the horizontal direction and an oblique direction (e.g., at an angle of 15° to the horizontal line) on the virtual screen to form the light distribution pattern P. The reflector 210 forms a projection image such that image parts P1' (i.e., the illuminance peak parts) corresponding to the edge E1 on the high brightness side of the light emitting device 2a are arranged (forming a line) along a horizontal cutoff line CL1 and an oblique cutoff line CL2. By this means, a light distribution pattern can be formed which is brightest near the horizontal cutoff line CL1 and the oblique cutoff line CL2 and which gradually decreases in illuminance when going downward from these cutoff lines so as to be excellent in far-distance visibility and suitable for a passing-each-other beam.

In the vehicle lamp 102 according to the present embodiment, the semiconductor light emitting device 2a that is a light source generates light having a peak of brightness at an edge of the light extraction surface (see FIG. 2C), and the reflector 210 forming an optical system arranges multiple unit projection images, reflecting this brightness distribution of the light source, along the cutoff lines to form a light distribution pattern. Hence, the vehicle lamp 102 can form the light distribution pattern suitable for a passing-each-other beam with suppressing the amount of light cut off by a light-shielding member such as a shade to a minimum. That is, the use efficiency of light from the semiconductor light emitting device 2a as a light source can be improved. Further, although the semiconductor light emitting device 2a as a light source has a non-uniform brightness distribution with a peak of brightness at an edge thereof, the wavelength converting layer has different wavelength conversion characteristics respectively at its portion covering an area of high brightness of the light emitting element of the semiconductor light emitting device and at its portion covering an area of low brightness, thus suppressing the occurrence of color unevenness in mixed light, as described previously, and hence also with the vehicle lamp 102 comprising this semiconductor light emitting device as a light source, light without color unevenness can be obtained.

Vehicle Lamp 3

FIG. 11 is a diagram showing the configuration of a vehicle lamp 103 (of a direct projection type) comprising, as a light source, any of the semiconductor light emitting devices 2a to 2f according to Embodiments 1 to 6 of the present invention. In FIG. 11 and the description below, the semiconductor light emitting device 2a is cited as a representative but can be replaced with any of the semiconductor light emitting devices 2b to 2f.

The semiconductor light emitting device 2a (hereinafter also called simply a light emitting device 2a) is mounted on a mounting board 200 and then placed such that the light extraction surface faces in a forward projection direction and that the edge E1 on the high brightness side on which the n-electrode 40 extends faces straight downward with the edge E2 on the low brightness side on which the n-electrode 40 does not extend facing straight upward. Light from the semiconductor light emitting device 2a is irradiated directly onto a projection lens 230 placed at the front in the projection direction, not via a light-reflecting surface.

The shade 220 is a light-shielding member which cuts off part of light from the light emitting device 2a to form cutoff lines. The shade 220 is placed between the light emitting device 2a and a projection lens 230 such that its upper edge is located at the focal point of the projection lens 230. The projection lens 230 projects light from the light emitting device 2a to be inverted vertically and to form a horizontally extended projection image.

With this configuration, a projection image, where image parts P1' (i.e., the illuminance peak parts) corresponding to the edge E1 on the high brightness side of the light emitting device 2a are arranged (forming a line) along the horizontal cutoff line CL1 and the oblique cutoff line CL2 as shown in FIG. 9, is formed on a virtual vertical screen located at the front in the projection direction of the vehicle lamp 103 as with the vehicle lamps 101 (of a reflector type) and 102 (of a projector type). By this means, a light distribution pattern can be formed which is brightest near the horizontal cutoff line CL1 and the oblique cutoff line CL2 and which gradually decreases in illuminance when going downward from these cutoff lines so as to be excellent in far-distance visibility and suitable for a passing-each-other beam.

In the vehicle lamp 103 according to the present embodiment, the semiconductor light emitting device 2a that is a light source has a peak of brightness at an edge of the light extraction surface (see FIG. 2C), and the projection lens 230 forming an optical system directly projects light-source images having this brightness distribution. Hence, the vehicle lamp 103 can form the light distribution pattern suitable for a passing-each-other beam with suppressing the amount of light cut off by a light-shielding member such as a shade to a minimum. That is, the use efficiency of light from the semiconductor light emitting device 2a as a light source can be improved. Further, although the semiconductor light emitting device 2a as a light source has a non-uniform brightness distribution with a peak of brightness at an edge thereof, the wavelength converting layer has different wavelength conversion characteristics respectively at its portion covering an area of high brightness of the light emitting element of the semiconductor light emitting device and at its portion covering an area of low brightness, thus suppressing the occurrence of color unevenness in mixed light, as described previously, and hence also with the vehicle lamp 103 comprising this semiconductor light emitting device as a light source, light without color unevenness can be obtained.

Embodiment 7

Figure 12A:
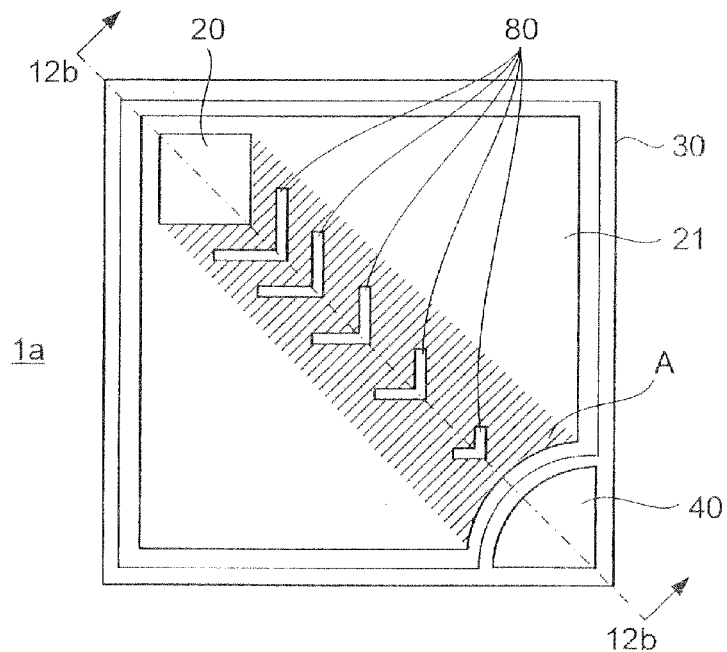
FIG. 12A is a plan view showing the configuration of a semiconductor light emitting element according to Embodiment 7 of the present invention.
Figure 12B:
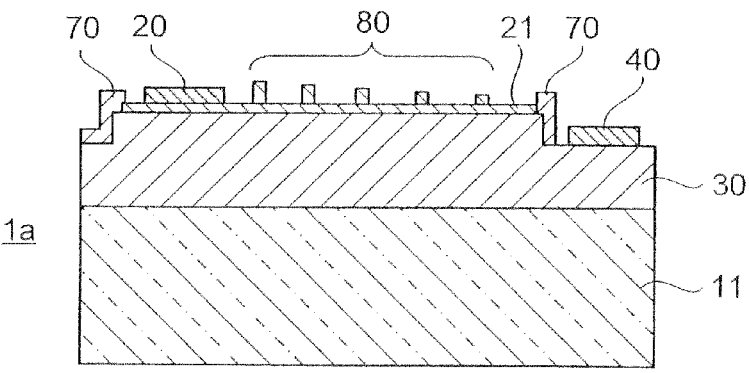
FIG. 12B is a cross-sectional view taken along line 12b-12b in FIG. 12A.

FIG. 12A is a plan view showing the structure of a semiconductor light emitting element 1a according to Embodiment 7 of the present invention, and FIG. 12B is a cross-sectional view taken along line 12b-12b in FIG. 12A. The semiconductor light emitting element 1a differs from the semiconductor light emitting element 1 according to the above embodiments in that the electrode placement and the like are determined such that the current density distribution and the brightness distribution are uniform at light emission operation. Also in a semiconductor light emitting element wherein the current density distribution and the brightness distribution at light emission operation are made uniform, it is difficult to maintain the uniformity of the current density distribution and the brightness distribution for any amount of fed current. Thus, as in the above embodiments 1 to 6 wherein the current density distribution and the brightness distribution are intentionally made non-uniform, it is necessary to dealt with non-uniformity.

The semiconductor light emitting element 1a is a light emitting element of a so-called lateral structure, where the p-electrode 20 and the n-electrode 40 face in the same direction. A growth substrate 11 is, for example, a sapphire substrate used in the crystal growth of a semiconductor film 30. The semiconductor film 30 is made of, e.g., group III nitride-based semiconductor crystals and configured with an n-type semiconductor layer, a light emitting layer, and a p-type semiconductor layer laid one over another in that order from the growth substrate 11 side. The n-electrode 40 is provided on the surface of the n-type semiconductor layer exposed by partially etching the semiconductor film 30 from the p-type semiconductor layer side. The n-electrode 40 is placed near a corner of the semiconductor film 30 having, e.g., a substantially rectangular outline. A transparent electrode 21 is made of conductive metal oxide such as ITO and formed to cover the entire surface of the p-type semiconductor layer. The transparent electrode 21 functions to promote current diffusion inside the semiconductor film 30. The p-electrode 20 is placed on the transparent electrode 21 and near the corner diagonally opposite the corner where the n-electrode 40 is formed. By placing the n-electrode 40 and the p-electrode 20 near diagonally opposite corners respectively, current diffusion inside the semiconductor film 30 is promoted. An insulating film 70 is a protective film covering an exposed surface formed by etching the semiconductor film 30 and is made of an insulator such as $SiO_2$.

The area A indicated by hatching in FIG. 12A is the area to which current constriction is likely to occur at light emission operation. The semiconductor film is generally higher in sheet resistance than electrode material, and it is difficult to make current diffuse in directions (laterally) along the principal surface of the semiconductor film. Especially, as to the p-type semiconductor layer, it is difficult to make its thickness large for the technical reason of the crystal growth method, and hence the distance of current diffusion in a direction (lateral direction) along the principal surface is smaller than in the other layers. Thus, current is likely to be constricted to the neighborhood of the p-electrode via which current is supplied. Especially, in a lateral element like the semiconductor light emitting element 1a according to the present embodiment, current is likely to be constricted to the area A around the shortest route between the p-electrode 20 and the n-electrode 40, so that the current density and brightness are relatively high.

The semiconductor light emitting element 1a has multiple protrusion structures 80 protruding from the surface of the transparent electrode 21 in the area A. The protrusion structure 80 is preferably made of a light transmissive insulator, and may be made of the same material (such as $SiO_2$) as the insulating film 70. The multiple protrusion structures 80 are discontinuous in the direction from the p-electrode 20 to the n-electrode 40.

Figure 12C:
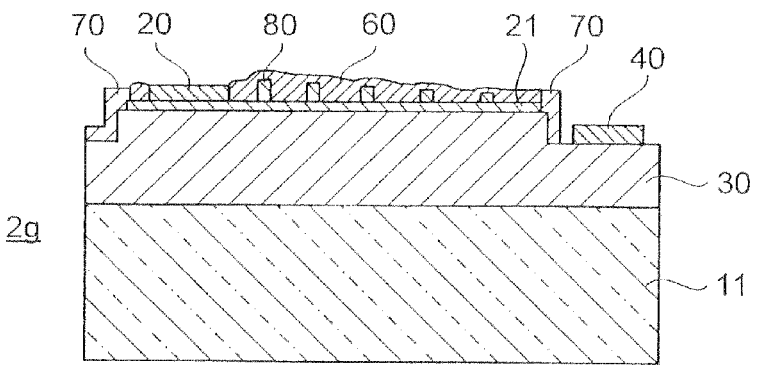
FIG. 12C is a cross-sectional view showing the configuration of a semiconductor light emitting device according to Embodiment 7 of the present invention.

FIG. 12C is a cross-sectional view showing the structure of a semiconductor light emitting device 2g according to Embodiment 7 of the present invention, which is configured with a wavelength converting layer containing a fluorescent substance and laid over the surface of the above semiconductor light emitting element 1a, which view is taken along line 12b-12b in FIG. 12A.

The wavelength converting layer 60 is made by, e.g., making a YAG-based yellow fluorescent substance dispersed uniformly across a binder such as silicone resin, epoxy resin, or acrylic resin. The wavelength converting layer 60 is formed by coating a fluorescent substance-contained resin over the surface of the semiconductor light emitting element 1a to cover the protrusion structures 80 by a dispense method, a spin coat method, or the like and then curing this. The part of the wavelength converting layer 60 covering the area A is made larger in thickness than the other parts by surface tension generated because of the multiple protrusion structures 80 formed. By this means, the proportion (mixing ratio) of blue light to yellow light becomes substantially the same over the light extraction surface of the semiconductor light emitting device 2g, and thus mixed light without color unevenness can be obtained.

As such, by forming multiple protrusion structures 80 on the surface of the semiconductor light emitting element 1a, the wavelength converting layer 60 can be partially adjusted in thickness very easily and highly accurately. Although partially adjusting the thickness of the wavelength converting layer 60 can be achieved by a printing method such as a screen printing method or an ink-jet method without providing protrusion structures as in this embodiment, the thickness adjustment on the order of submicron to several micron can be performed by thickness adjustment using the protrusion structures 80. To make the thickness of the part of the wavelength converting layer 60 covering the area A larger, the heights of the protrusion structures 80 should be increased, or the spaces between the protrusion structures 80 should be reduced, or these should be performed in combination. In the semiconductor light emitting element 1a according to the present embodiment, the heights of the protrusion structures 80 gradually decrease along the direction from the p-electrode 20 to the n-electrode 40 with the spaces between adjacent protrusion structures gradually increasing. By this means, the thickness of the part of the wavelength converting layer 60 covering the area A is made to continuously decrease along the direction from the p-electrode 20 to the n-electrode 40, and thus the thickness distribution of the wavelength converting layer 60 can be made to exactly correspond to the current density distribution or the brightness distribution of the semiconductor light emitting element 1a.

Manufacturing Method

The manufacturing method of the semiconductor light emitting device 2g having the above configuration will be described below with reference to FIGS. 13A to 13E.

Figure 13A:
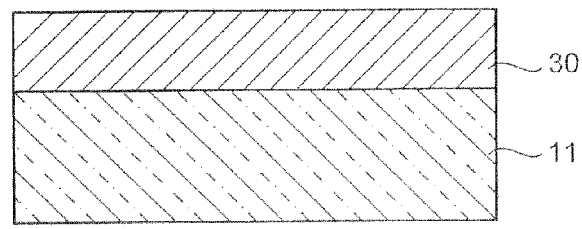
FIGS. 13A to 13E are cross-sectional views showing a manufacturing method of the semiconductor light emitting device according to Embodiment 7 of the present invention.

A sapphire substrate as a growth substrate 11 is prepared. The semiconductor film 30 made of group III nitride-based semiconductors is formed on the sapphire substrate by metal organic chemical vapor deposition (MOCVD). The semiconductor film 30 is formed by laying an n-type semiconductor layer, a light emitting layer, and a p-type semiconductor layer one over another from the growth substrate 11 side (FIG. 13A).

Figure 13B:
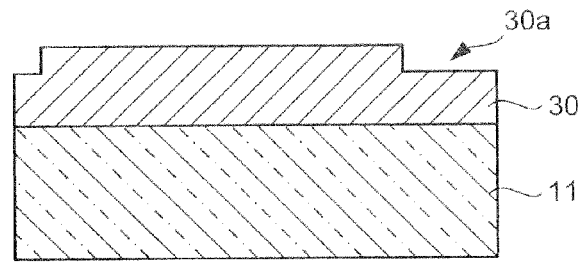

Then, the semiconductor film 30 is etched from the surface side of the p-type semiconductor layer to form a recess 30a, where the n-electrode 40 is to be formed, so as to make the n-type semiconductor layer partially exposed at the bottom of the recess 30a (FIG. 13B).

Figure 13C:
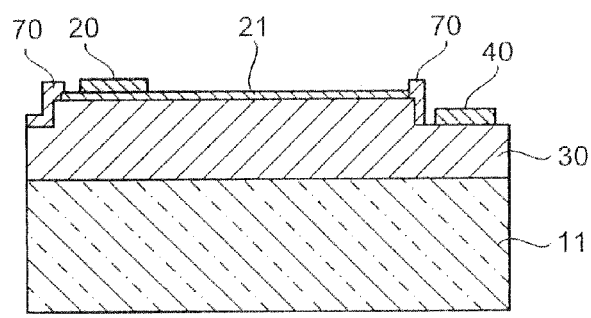

Then, the transparent electrode 21 and the p-electrode 20, and the n-electrode 40 are formed respectively on the surface of the p-type semiconductor layer of the semiconductor film 30 and the surface of the n-type semiconductor layer partially exposed at the bottom of the recess 30a. The n-electrode 40 is formed by sequentially depositing Ti, Al, Ti, and Au over the n-type semiconductor layer partially exposed at the bottom of the recess 30a by, e.g., an electron beam evaporation method and then patterning it by a lift-off method or the like. The transparent electrode 21 is formed by depositing conductive metal oxide such as ITO over the surface of the p-type semiconductor layer by a sputtering method or the like and then patterning this by an etching method or the like. The transparent electrode 21 is formed to cover substantially the entire surface of the p-type semiconductor layer. The p-electrode 20 is formed by sequentially depositing Pt, Ag, Ti, and Au over the transparent electrode 21 by an electron beam evaporation method or the like and then patterning it by a lift-off method or the like. Then, an end surface of the semiconductor film 30 exposed by forming the recess 30a is covered by a sputtering method or the like with the insulating film 70 made of an insulator such as $SiO_2$ (FIG. 13C).

Figure 13D:
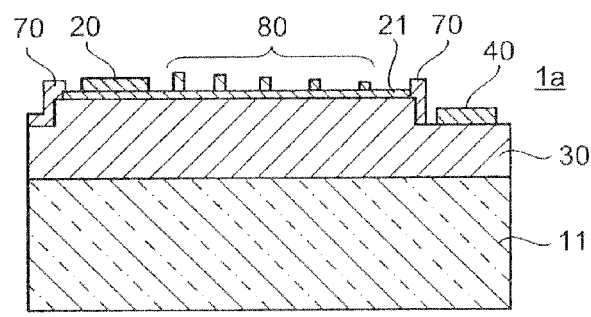

Then, the multiple protrusion structures 80 are formed in the area A shown in FIG. 12A, where the current density (brightness) is higher at light emission operation. The protrusion structures 80 are preferably made of a light transmissive insulator, and may be made of the same material (such as $SiO_2$) as the insulating film 70. In this case, because the insulating film 70 and the protrusion structures 80 can be formed at the same time, the process can be simplified. The protrusion structures 80 are formed by forming an insulating film of $SiO_2$ or the like over the transparent electrode 21 by, e.g., a CVD method, an electron beam evaporation method, a sputtering method, or the like and then etching or lifting off the unnecessary parts by photolithography. The wavelength converting layer 60 can be partially adjusted in thickness by setting the shapes, sizes, heights, and in-between spaces of the protrusion structures 80 as needed. By undergoing the above processes, the semiconductor light emitting element 1a is finished (FIG. 13D).

Figure 13E:
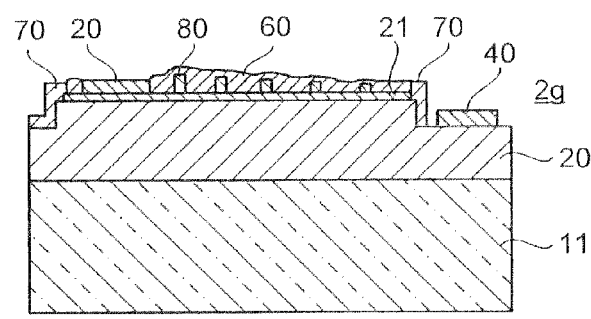

Next, a fluorescent substance-contained resin is prepared in which a YAG-based yellow fluorescent substance is dispersed uniformly across a binder such as silicone resin, epoxy resin, or acrylic resin. Then, the fluorescent substance-contained resin is coated over the surface of the semiconductor light emitting element 1a to bury the protrusion structures 80 by a dispense method, a spin coat method, or the like. Then, the fluorescent substance-contained resin is thermally cured so that the wavelength converting layer 60 is formed over the surface of the semiconductor light emitting element 1a. The parts of the wavelength converting layer 60 over and around the protrusion structures 80 are larger in thickness than the other parts with no protrusion structure 80 by the amount depending on the heights of the protrusion structures 80. And the thickness of the wavelength converting layer 60 in the area where the multiple protrusion structures 80 are formed is larger than in the areas where protrusion structures 80 are not formed, and the thickness distribution corresponding to the current density distribution (brightness distribution) of the semiconductor light emitting element 1a is formed. By undergoing the above processes, the semiconductor light emitting device 2g is finished (FIG. 13E).

Embodiment 8

Figure 14A:
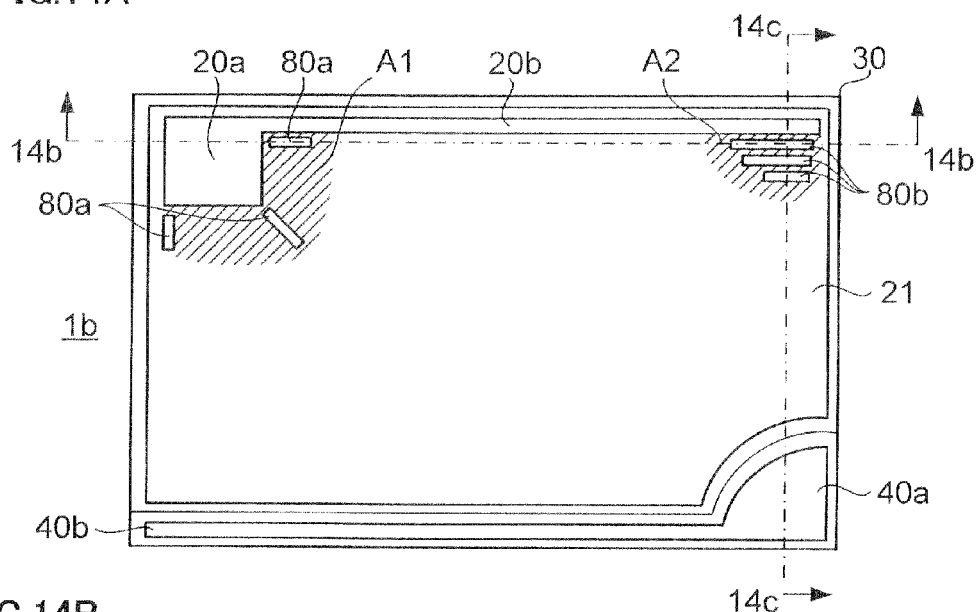
FIG. 14A is a plan view showing the configuration of a semiconductor light emitting element according to Embodiment 8 of the present invention.

FIG. 14A is a plan view showing the structure of a semiconductor light emitting element 1b according to Embodiment 8 of the present invention. The semiconductor light emitting element 1b is a light emitting element of a lateral structure, where the electrode placement and the like are determined such that the current density distribution and the brightness distribution are uniform at light emission operation, like the semiconductor light emitting element 1a according to the above embodiment 7.

The semiconductor light emitting element 1b differs from the semiconductor light emitting element 1a according to the above embodiment 7 in the configuration of the n-electrode and p-electrode. That is, the n-electrode has a pad portion 40a placed near a corner of the semiconductor film 30 having a substantially rectangular outline and a line portion 40b extending from the pad portion 40a along a long side of the semiconductor light emitting element 1b. The p-electrode 20 has a pad portion 20a placed on the transparent electrode 21 and in the corner diagonally opposite the corner where the pad portion 40a of the n-electrode is formed and a line portion 20b extending from the pad portion 20a along a long side of the semiconductor light emitting element 1b. That is, the line portion 20b of the p-electrode and the line portion 40b of the n-electrode extend in parallel along opposite long sides. As such, by providing the n-electrode and the p-electrode with the line portions 20b and 40b respectively, current diffusion inside the semiconductor film 30 can be promoted.

The areas A1 and A2 indicated by hatching in FIG. 14A are the areas to which current constriction is likely to occur at light emission operation (the current density and brightness are likely to become higher). Where the n-electrode and the p-electrode have the line portions 20b and 40b as described above, current diffusion inside the semiconductor film 30 is promoted, so that current constriction is less likely to occur than in the semiconductor light emitting element 1a according to the above embodiment 7. However, when fed current increases, current is likely to be constricted to the area A1 beside the pad portion 20a of the p-electrode and to the area A2 near the end of the line portion 20b of the p-electrode, the distance of which to the pad portion 40a of the n-electrode is the shortest. That is, in the areas A1 and A2, the current density and brightness are likely to become relatively high. The semiconductor light emitting element 1b has multiple protrusion structures 80a and 80b protruding from the surface of the transparent electrode 21 in the areas A1 and A2 respectively. In this embodiment, the multiple protrusion structures 80a provided in the area A1 extend radially from the pad portion 20a of the p-electrode. The multiple protrusion structures 80b provided in the area A2 extend in a direction parallel to the line portion 20b of the p-electrode. The shapes, sizes, heights, and in-between spaces of the protrusion structures 80a and 80b can be changed as needed.

Figure 14B:
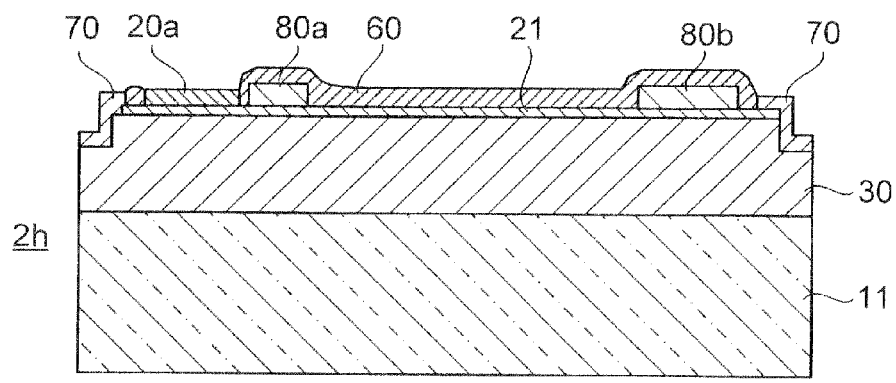
FIGS. 14B and 14C are cross-sectional views showing the configuration of a semiconductor light emitting device according to Embodiment 8 of the present invention.
Figure 14C:
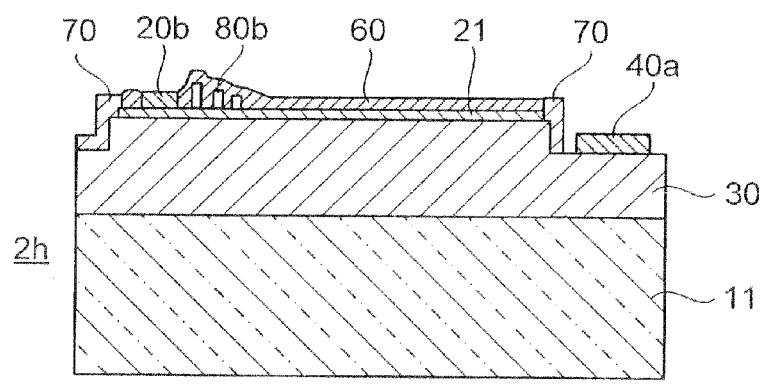

FIGS. 14B and 14C are cross-sectional views showing the structure of a semiconductor light emitting device 2h according to Embodiment 8 of the present invention, which is configured with a wavelength converting layer containing a fluorescent substance and laid over the surface of the above semiconductor light emitting element 1b, which views are taken along lines 14b-14b and 14c-14c in FIG. 14A respectively. The wavelength converting layer 60 is made by, e.g., making a YAG-based yellow fluorescent substance dispersed uniformly across a binder such as silicone resin, epoxy resin, or acrylic resin. The wavelength converting layer 60 is formed by coating a fluorescent substance-contained resin over the surface of the semiconductor light emitting element 1b by a dispense method, a spin coat method, or the like and then curing this. The parts of the wavelength converting layer 60 covering the areas A1 and A2 are made larger in thickness than the other parts by surface tension generated because of the multiple protrusion structures 80a and 80b formed. By this means, the proportion (mixing ratio) of blue light to yellow light becomes substantially the same over the light extraction surface of the semiconductor light emitting device 2h, and thus mixed light without color unevenness can be obtained. The parts of the wavelength converting layer 60 covering the areas A1 and A2 can be controlled in thickness by changing the shapes, sizes, heights, and in-between spaces of the protrusion structures 80a and 80b.

Figure 15:
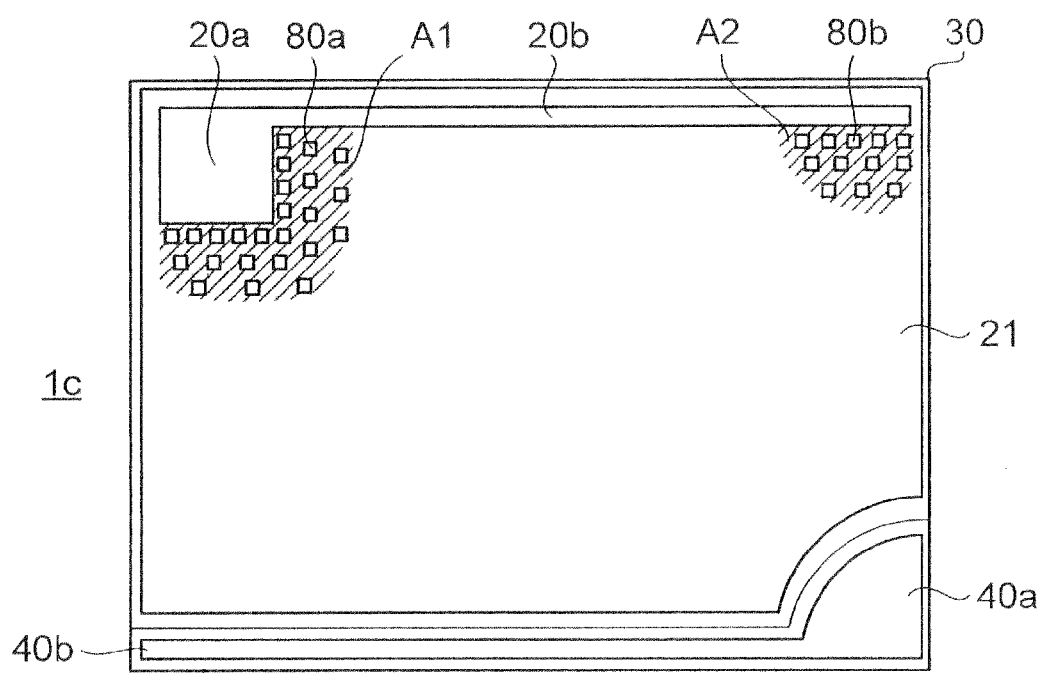
FIG. 15 is a plan view showing the configuration of a semiconductor light emitting element according to an embodiment of the present invention.

As such, by forming multiple protrusion structures 80a and 80b on the surface of the semiconductor light emitting element 1b, the wavelength converting layer 60 can be partially adjusted in thickness very easily and highly accurately. FIG. 15 is a plan view of a semiconductor light emitting element 1c according to a modified example different from the above semiconductor light emitting element 1b in the form of protrusion structures. The protrusion structures 80a and 80b provided in the areas A1 and A2 respectively may be constituted by multiple dot-like structures.

Embodiment 9

Figure 16A:
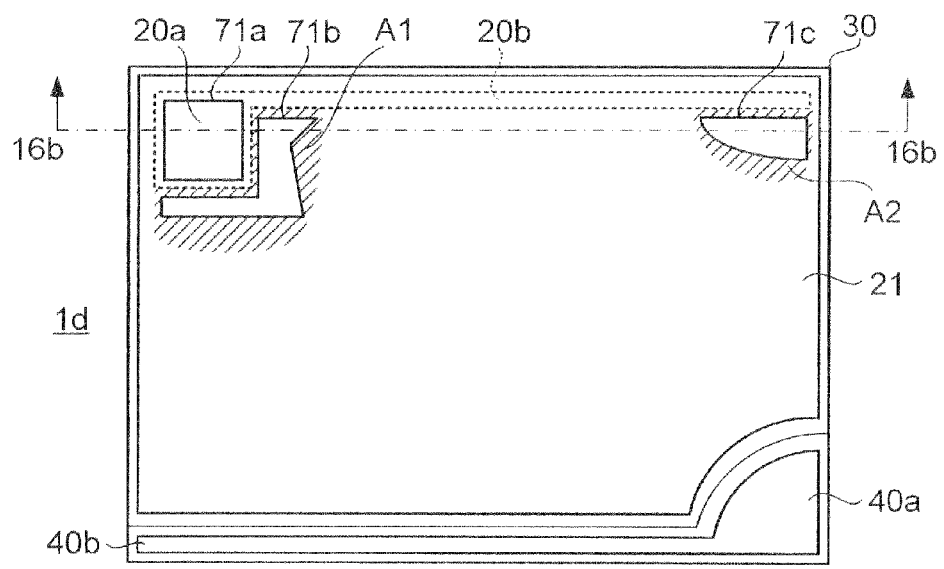
FIG. 16A is a plan view showing the configuration of a semiconductor light emitting element according to Embodiment 9 of the present invention.

FIG. 16A is a plan view showing the structure of a semiconductor light emitting element 1d according to Embodiment 9 of the present invention. The semiconductor light emitting element 1d has the same electrode configuration as the semiconductor light emitting element 1b according to the above embodiment 8. Thus, current is likely to be constricted to the area A1 beside the pad portion 20a of the p-electrode and the area A2 near the end of the line portion 20b of the p-electrode.

The semiconductor light emitting element 1d according to the present embodiment has an insulating film 71 made of an insulator such as SiO$_2$ covering substantially the entire upper surface that is its principal light emitting surface. The insulating film 71 functions as a light-transmissive, protective film to protect the surface of the semiconductor light emitting element 1d. The pad portion 20a of the p-electrode is exposed through an opening 71a in the insulating film 71. The insulating film 71 has openings 71b and 71c in the areas A1 and A2 respectively as well. The transparent electrode 21 is partially exposed through the openings 71b and 71c.

Figure 16B:
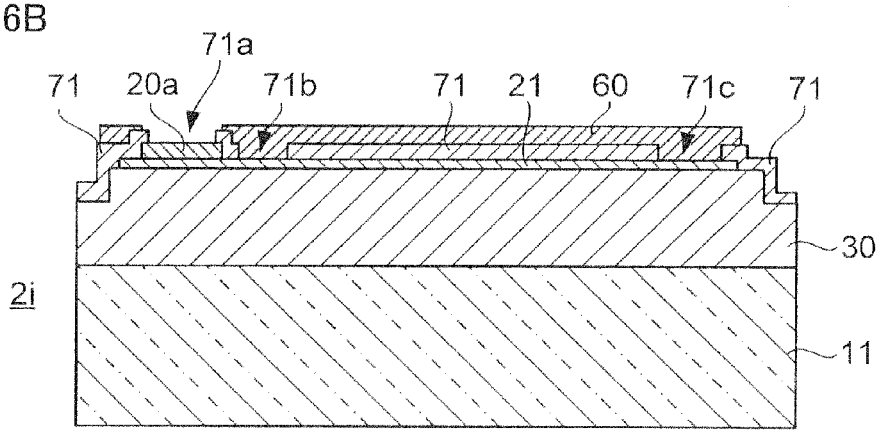
FIG. 16B is a cross-sectional view showing the configuration of a semiconductor light emitting device according to Embodiment 9 of the present invention.

FIG. 16B is a cross-sectional view showing the structure of a semiconductor light emitting device 2i according to Embodiment 9 of the present invention, which is configured with a wavelength converting layer containing a fluorescent substance and laid over the surface of the semiconductor light emitting element 1d, which view is taken along line 16b-16b in FIG. 16A. The wavelength converting layer 60 is made by, e.g., making a YAG-based yellow fluorescent substance dispersed uniformly across a binder such as silicone resin, epoxy resin, or acrylic resin. The wavelength converting layer 60 is formed by coating a fluorescent substance-contained resin over the surface of the semiconductor light emitting element 1d by a dispense method, a spin coat method, or the like and then curing this. The wavelength converting layer 60 fills the openings 71b and 71c made in the insulating film 71, provided in the areas A1 and A2. That is, the parts of the wavelength converting layer 60 having filled the openings 71b and 71c are larger in thickness than the other parts. By this means, the proportion (mixing ratio) of blue light to yellow light becomes substantially the same over the light extraction surface of the semiconductor light emitting device 2i, and thus mixed light without color unevenness can be obtained.

As such, by providing the openings 71a and 71b in the insulating film 71 covering the surface of the semiconductor light emitting element 1d and forming the wavelength converting layer 60 on the insulating film 71 so as to fill the openings 71a and 71b, the wavelength converting layer 60 can be partially adjusted in thickness very easily and highly accurately. With this structure, the upper surface of the wavelength converting layer 60 that is the outermost surface of the semiconductor light emitting device 2i can be made a flat surface, and hence the semiconductor light emitting device 2i becomes easy to handle when it is being mounted, for example, easy to pick up and so on. Further, the outermost surface of the semiconductor light emitting device 2i being flat can prevent local variation in light extraction efficiency, thus making the optical design easier. Note that as shown in some of the above embodiments the concentration and type of a fluorescent substance to be dispersed across the wavelength converting layer 60 may be made different for each area. For example, the concentration of the fluorescent substance in the part of the wavelength converting layer to fill the openings 71b and 71c in the insulating film 71 may be higher than in the other parts, and the dominant wavelength at light emission of the fluorescent substance in that part may be shorter than in the other parts.

Manufacturing Method

Figure 17A:
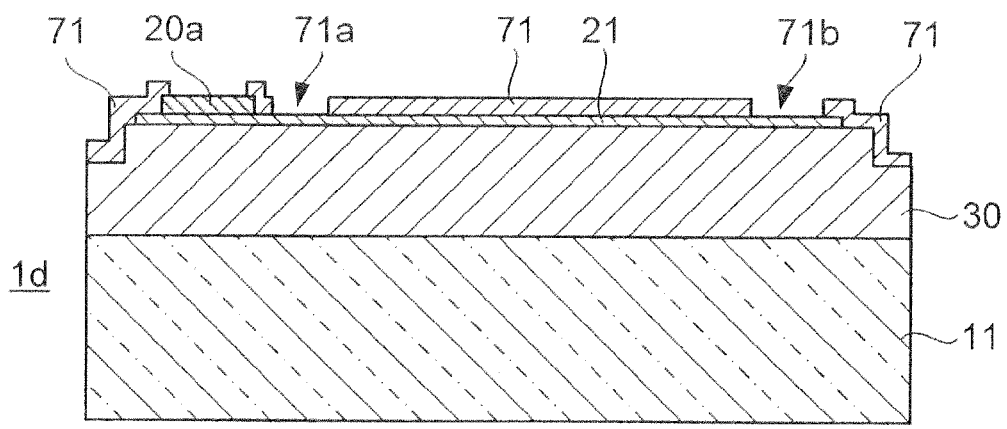
FIGS. 17A and 17B are cross-sectional views showing a manufacturing method of the semiconductor light emitting device according to Embodiment 9 of the present invention.
Figure 17B:
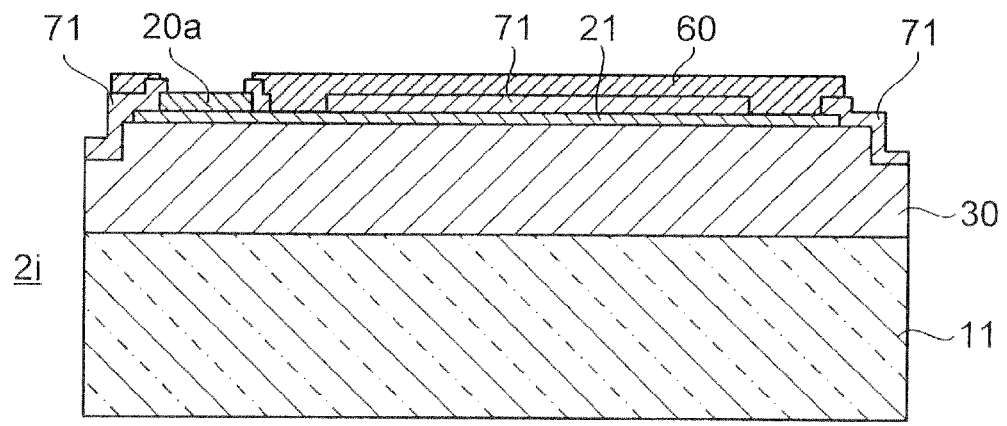

The manufacturing method of the semiconductor light emitting device 2h having the above configuration will be described below with reference to FIGS. 17A and 17B. The process until the completion of forming the n-electrode and the p-electrode is the same as in the manufacturing method of the semiconductor light emitting device 2g described previously (see FIGS. 13A-13E), and hence description thereof is omitted.

After the n-electrode and the p-electrode are formed on the semiconductor film 30, the insulating film 71 made of an insulator such as SiO$_2$ is formed to cover the entire upper surface and side surfaces of the semiconductor film 30 by a sputtering method or the like. Then, the opening 71a is formed in the insulating film 71 over the transparent electrode 21 to make the pad portion 20a of the p-electrode exposed. Then, the openings 71b and 71c are formed respectively in the areas A1 and A2 where the current density (brightness) is higher at light emission operation. These openings can be formed using, for example, an etching method or a lift-off method. The openings 71b and 71c can be formed to have an arbitrary shape and size (FIG. 17A).

Next, a fluorescent substance-contained resin is prepared in which a YAG-based yellow fluorescent substance is dispersed uniformly across a binder such as silicone resin, epoxy resin, or acrylic resin. Then, the fluorescent substance-contained resin is coated over the surface of the semiconductor light emitting element 1d to cover the insulating film 71 by a dispense method, a spin coat method, or the like. The fluorescent substance-contained resin fills the openings 71b and 71c formed in the insulating film 71. Subsequently, the fluorescent substance-contained resin is thermally cured so that the wavelength converting layer 60 is formed over the surface of the semiconductor light emitting element 1d. The parts of the wavelength converting layer 60 having filled the openings 71a and 71b are larger in thickness than the other parts, and the thickness distribution corresponding to the current density distribution (brightness distribution) of the semiconductor light emitting element 1d is formed. Note that by making the thickness of the insulating film 71 larger, the thickness difference between the parts of the wavelength converting layer 60 having filled the openings 71a, 71b and the other parts can be made larger so as to correspond to the high-low difference in brightness over the semiconductor light emitting element. By undergoing the above processes, the semiconductor light emitting device 2i is finished (FIG. 17B).

As obvious from the above description, in the semiconductor light emitting device according to the embodiments of the present invention, the wavelength converting layer covering the light emitting surface of the semiconductor light emitting element has different wavelength conversion characteristics respectively at its portion covering an area of relatively high current density of the light emitting element and at its portion covering an area of relatively low current density so as to reduce the chromaticity difference occurring in mixed light due to the non-uniform current density distribution in the semiconductor light emitting element at light emission operation, and hence even though the brightness distribution or emission wavelength distribution over the light emitting surface of the semiconductor light emitting element is non-uniform, the occurrence of color unevenness in mixed light can be suppressed. Thus, a uniform emission color can be obtained with a desired brightness distribution being formed, and therefore the semiconductor light emitting device can be a light source suitable for use in, e.g., vehicle lamps.

Further, with the vehicle lamps according to embodiments of the present invention, a projection image is formed such that image parts corresponding to the part having a peak of brightness of the semiconductor light emitting device form a line along the cutoff line, and hence a light distribution pattern suitable for a passing-each-other beam can be formed with suppressing the amount of light cut off by a light-shielding member such as a shade to a minimum. Thus the use efficiency of light from the semiconductor light emitting device as a light source can be improved. Because the semiconductor light emitting device according to the present invention emits mixed light without color unevenness as described above, also with the vehicle lamp comprising this semiconductor light emitting device as a light source, a projection image without color unevenness can be generated.

This application is based on Japanese Patent Application No. 2011-229975 which is herein incorporated by reference.

What is claimed is:

1. A semiconductor light emitting device comprising:
a support substrate;
a semiconductor light emitting element including:
    a semiconductor film comprising a first semiconductor layer, a light emitting layer that emits blue light due to current injection, and a second semiconductor layer, wherein the first semiconductor layer, the light emitting layer and the second semiconductor layer are layered one over another in this order from a side of the support substrate;
    a first electrode which is planarly formed between and which contacts with the support substrate and the first semiconductor layer, and
    a second electrode which is connected to the second semiconductor layer,
    wherein the semiconductor light emitting element has non-uniformity of current density in the light emitting layer at a light emission operation, the light emitting layer being placed over the first electrode and in a range of the first electrode, so that the semiconductor light emitting element has a current density or brightness distribution having a peak which exists near an edge on a first side of the first electrode in a first area and gradually decreasing toward an edge on a second side of the first electrode in a second area in such a manner that a wavelength of light emitted from the first area of relatively high current density at the light emission operation becomes shorter than a wavelength of light emitted from the second area of relatively low current density at the light emission operation; and
a wavelength converting layer containing a yellow fluorescent substance and layered to cover an overlap range of the light emitting layer and the first electrode to cover the first and second areas of the semiconductor light emitting element, the wavelength converting layer having a light extraction surface through which mixed light passes, the mixed light including both light having been wavelength-converted by the wavelength converting layer and light having passed through the wavelength converting layer without being wavelength-converted by the wavelength converting layer,
wherein the wavelength converting layer has different wavelength conversion characteristics respectively, over the overlap range of the light emitting layer and the first electrode, at a first portion of the wavelength converting layer covering the first area of the semiconductor light emitting element and at a second portion of the wavelength converting layer covering the second area of the semiconductor light emitting element, so as to reduce chromaticity difference of the mixed light over the light extraction surface due to the non-uniformity of current density in the light emitting layer at the light emission operation, to have the mixed light turn to white color light at both of the first and second portions covering the first and second areas of the semiconductor light emitting element.

2. A vehicle lamp which includes the semiconductor light emitting device according to claim 1 as a light source, comprising:
an optical system that projects light from said semiconductor light emitting device in an irradiation direction to form a projection image on an irradiation plane,
wherein said semiconductor light emitting device has a brightness distribution corresponding to a current density distribution at light emission operation of the semiconductor light emitting element, and
wherein said optical system forms said projection image such that image parts corresponding to a part having a peak of brightness of said semiconductor light emitting device form a line along a cutoff line.

3. The semiconductor light emitting device according to claim 1, wherein the second electrode is formed opposite to the first electrode across the light emitting layer and is partially placed above and within the first area.

4. The semiconductor light emitting device according to claim 1, wherein said wavelength converting layer has the first portion covering the first area and the second portion covering the second area, and wherein a dominant wavelength at light emission of the yellow fluorescent substance contained in said first portion is shorter than a dominant wavelength at light emission of the yellow fluorescent substance contained in said second portion.

5. The semiconductor light emitting device according to claim 4, wherein a thickness of said first portion is larger than a thickness of said second portion.

6. The semiconductor light emitting device according to claim 4, wherein a concentration of the yellow fluorescent substance contained in said first portion is higher than a concentration of the yellow fluorescent substance contained in said second portion.

7. The semiconductor light emitting device according to claim 1, wherein said wavelength converting layer has a thickness distribution where a thickness of the first portion covering the first area is larger than a thickness of the second portion covering the second area.

8. The semiconductor light emitting device according to claim 1, wherein said wavelength converting layer has a fluorescent-substance concentration distribution where a fluorescent-substance concentration of the first portion covering the first area is larger than a fluorescent-substance concentration of the second portion covering the second area.

* * * * *